(12) United States Patent
Fujiwara et al.

(10) Patent No.: US 12,304,855 B2
(45) Date of Patent: *May 20, 2025

(54) CHEMICALLY STRENGTHENED GLASS AND METHOD FOR MANUFACTURING SAME

(71) Applicant: AGC Inc., Tokyo (JP)

(72) Inventors: Yusuke Fujiwara, Tokyo (JP); Yoichi Takato, Tokyo (JP); Yusuke Kobayashi, Tokyo (JP); Masao Ozeki, Tokyo (JP); Yusuke Morishima, Tokyo (JP); Takumi Nagasako, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/775,847

(22) Filed: Jul. 17, 2024

(65) Prior Publication Data
US 2024/0368032 A1 Nov. 7, 2024

Related U.S. Application Data

(63) Continuation of application No. 18/768,142, filed on Jul. 10, 2024, which is a continuation of application No. PCT/JP2023/040661, filed on Nov. 10, 2023.

(30) Foreign Application Priority Data

| | | |
|---|---|---|
| Nov. 15, 2022 | (JP) | 2022-182870 |
| Mar. 29, 2023 | (JP) | 2023-054157 |
| Sep. 29, 2023 | (JP) | 2023-170427 |

(51) Int. Cl.
*C03C 3/083* (2006.01)
*C03C 3/076* (2006.01)
(Continued)

(52) U.S. Cl.
CPC .............. *C03C 3/083* (2013.01); *C03C 3/076* (2013.01); *C03C 21/002* (2013.01);
(Continued)

(58) Field of Classification Search
CPC .............. H01L 31/048; H01L 31/0481; H01L 31/0488; C03C 3/076; C03C 3/083; H10F 19/804; H10F 19/807
See application file for complete search history.

(56) References Cited

U.S. PATENT DOCUMENTS

| | | |
|---|---|---|
| 2009/0159112 A1 | 6/2009 | Kushiya et al. |
| 2016/0130178 A1 | 5/2016 | Kashima et al. |
| (Continued) | | |

FOREIGN PATENT DOCUMENTS

| | | |
|---|---|---|
| JP | 2007-123725 A | 5/2007 |
| JP | 2022-170718 A | 11/2022 |
| (Continued) | | |

OTHER PUBLICATIONS

Notice of Reasons for Refusal mailed on Mar. 12, 2024, with machine-generated English Translation, total 8 pages, (previously submitted).

(Continued)

*Primary Examiner* — Lindsey A Buck
(74) *Attorney, Agent, or Firm* — Oblon, McClelland, Maier & Neustadt, L.L.P.

(57) ABSTRACT

A chemically strengthened glass has a thickness of more than 2 mm, a surface compressive stress $CS_0$ of 400 MPa to 1200 MPa, a depth of compressive stress layer DOL-tail of 2.7 μm to 30.0 μm, an absolute value of an average slope of a stress profile from a surface to the DOL-tail of 20 MPa/μm to 500 MPa/μm, and a tensile stress CT of 1.0 MPa to 16 MPa.

20 Claims, 7 Drawing Sheets

(51) Int. Cl.
  *C03C 19/00* (2006.01)
  *C03C 21/00* (2006.01)
  *H10F 19/80* (2025.01)
(52) U.S. Cl.
  CPC ......... *H10F 19/804* (2025.01); *H10F 19/807* (2025.01); *C03C 19/00* (2013.01); *C03C 2204/00* (2013.01)

(56) References Cited

U.S. PATENT DOCUMENTS

| | | |
|---|---|---|
| 2016/0130179 A1 | 5/2016 | Kashima et al. |
| 2016/0207828 A1 | 7/2016 | Kashima et al. |
| 2017/0313621 A1 | 11/2017 | Kashima et al. |
| 2018/0072619 A1 | 3/2018 | Kashima et al. |
| 2020/0132521 A1 | 4/2020 | Akiba et al. |
| 2022/0003576 A1 | 1/2022 | Akiba et al. |
| 2022/0112126 A1 | 4/2022 | Saito et al. |
| 2023/0086147 A1 | 3/2023 | Akiba et al. |

FOREIGN PATENT DOCUMENTS

| | | |
|---|---|---|
| WO | WO 2015/008764 A1 | 1/2015 |
| WO | WO 2016/117474 A1 | 7/2016 |
| WO | WO 2017/146063 A1 | 8/2017 |
| WO | WO 2018/074198 A1 | 4/2018 |
| WO | WO 2018/154973 A1 | 8/2018 |
| WO | WO 2019/009336 A1 | 1/2019 |
| WO | WO 2019/017404 A1 | 1/2019 |
| WO | WO 2020/262293 A1 | 12/2020 |

OTHER PUBLICATIONS

International Search Report issued Jan. 30, 2024 in PCT/JP2023/040661 filed on Nov. 10, 2023, 3 pages.

Notice of Reasons for Refusal mailed on Mar. 12, 2024, with machine-generated English Translation, total 8 pages.

Decision to Grant a Patent mailed on May 7, 2024, machine-generated with English Translation.

FIG. 4

| GLASS MATERIAL | Ex.1 | Ex.2 | Ex.7 | Ex.15 |
|---|---|---|---|---|
| | A | A | A | B |
| THICKNESS [mm] | 3.5 | 3.5 | 3.5 | 3.5 |

CHEMICALLY STRENGTHENED GLASS AND METHOD FOR MANUFACTURING SAME

CROSS-REFERENCE TO RELATED APPLICATIONS

This application is a continuation of and claims benefit under 35 U.S.C. § 120 to U.S. application Ser. No. 18/768,142, filed Jul. 10, 2024, which is a continuation of PCT/JP2023/040661, filed on Nov. 10, 2023, and claims the benefit of priority under 35 U.S.C. § 119 from JP 2022-182870 filed on Nov. 15, 2022, JP 2023-170427 filed on Sep. 29, 2023, and JP 2023-054157 filed on Mar. 29, 2023, the entire contents of each of which are incorporated herein by reference.

TECHNICAL FIELD

The present invention relates to a production method for a chemically strengthened glass and a chemically strengthened glass. In particular, the present invention relates to a chemically strengthened glass suitable as a glass for protecting a sensor module and a sensor or an oscillator, and a production method therefor.

BACKGROUND ART

Moving devices such as a car, a train, and a drone, and security devices such as an outdoor sensor and a surveillance camera, are equipped with a plurality of sensors with diverse functions. Depending on a structure and a material of a protective member, the use of the sensor may be impeded, so that the type of the sensor to be disposed inside the protective member is also a factor in selecting the structure and the material of the protective member.

It is desirable to select, as the material of the protective member that protects the sensor, a material having high transmittance for visible light and excellent strength. A sensor module that uses a glass as the protective member that protects the sensor is known. For example, Patent Literature 1 discloses a sensor module that uses a chemically strengthened glass as a protective member.

Due to the increasing demand for energy conservation in recent years, there has been an increase in cases where solar cell arrays are installed on the exterior (for example, on the rooftop or roof) of buildings. A solar cell array is constructed by arranging a plurality of panel-shaped solar cell modules in a plane and connecting the solar cell modules in series and in parallel. On the solar cell modules installed on the exterior of buildings, protective members for protect them from weather such as hail and snow, falling objects, and the like are used. Patent Literature 2 discloses a solar cell module including a glass as a protective member for the solar cell module.

A chemically strengthened glass is obtained by forming a compressive stress layer on a surface portion of a glass by an ion exchange treatment in which the glass is brought into contact with an inorganic salt composition such as sodium nitrate and potassium nitrate. In the ion exchange treatment, ion exchange occurs between alkali metal ions contained in the glass and alkali metal ions having a greater ion radius contained in the inorganic salt composition, and the compressive stress layer is formed on the surface portion of the glass. The strength of the chemically strengthened glass depends on a stress profile represented by a compressive stress (hereinafter also abbreviated as CS) with the depth from the glass surface as a variable.

CITATION LIST

Patent Literature

Patent Literature 1: WO 2019/009336
Patent Literature 2: JP2007-123725A

SUMMARY OF INVENTION

Technical Problem

The strength required for the glass to be used as the protective member for sensors and solar cell modules can be broadly divided into three types. The first is flying stone resistance. For example, in the case where a sensor is mounted on a moving device, a foreign object such as a flying stone may collide with the sensor module while the device is moving. In this way, when an instantaneous external impact is applied due to the collision of a flying stone or the like, the stress during the collision is not alleviated and the stress is concentrated, which may damage the glass as the protective member and the sensor. Therefore, the glass that protects the sensor is required to have excellent flying stone resistance. The second is drop ball impact strength (hereinafter also abbreviated as "drop ball strength"). The glass as the protective member is required to have strength enough not to break easily when the glass collides with an object or is dropped. Thirdly, since scratches on the glass surface caused by collisions with a flying stone or the like, and the resulting cracks and deterioration of the appearance are problematic, scratch resistance against the flying stone (hereinafter also abbreviated as "scratch resistance"), which reduces the area and depth of the scratches, is required.

Therefore, an object of the present invention is to provide a chemically strengthened glass exhibiting flying stone resistance, drop ball strength, and scratch resistance more excellent than those in the related art, and a production method therefor.

Solution to Problem

After studying the above problems, the inventors of the present invention have found that when a glass for chemical strengthening having a thickness of more than 2 mm is subjected to ion exchange using a molten salt composition containing potassium nitrate as a main component, a chemically strengthened glass having a specific stress profile can be obtained, and flying stone resistance, drop ball strength, and scratch resistance can be improved by using the chemically strengthened glass. Thus, the present invention has been completed.

The present invention is as follows.

1. A chemically strengthened glass having a thickness of more than 2 mm, having a surface compressive stress $CS_0$ of 400 MPa to 1,200 MPa, a depth of compressive stress layer DOL-tail of 2.7 µm to 30.0 µm, an absolute value of an average slope of a stress profile from a surface to the DOL-tail of 20 MPa/µm to 500 MPa/µm, and a tensile stress CT of 1.0 MPa to 16 MPa.

2. The chemically strengthened glass according to the above 1, having an absolute value of an average slope of the stress profile from a position 50 µm from the surface to a DOC of 0.00 MPa/µm to 0.90 MPa/µm.

3. The chemically strengthened glass according to the above 1 or 2, in which a difference between an average concentration of Na from a depth of 25 μm to 30 μm from the surface and a concentration of Na at a thickness center portion is 1% or less as represented by mol % based on oxides.

4. The chemically strengthened glass according to any one of the above 1 to 3, having an integrated value (MPa·μm) of the tensile stress of 20,000 or less.

5. The chemically strengthened glass according to any one of the above 1 to 4, which is a lithium-containing aluminosilicate glass.

6. The chemically strengthened glass according to any one of the above 1 to 5, in which an absolute value of a difference between a maximum arrest line depth and a minimum arrest line depth is 650 μm or more.

7. The chemically strengthened glass according to any one of the above 1 to 6, in which an absolute value of a difference between a maximum arrest line depth and a maximum crack depth is 40 μm or more.

8. The chemically strengthened glass according to any one of the above 1 to 7, in which a crack occurrence rate evaluated according to a strength test method in ISO 20567-1 Test Method B is 20% or less.

9. The chemically strengthened glass according to any one of the above 1 to 8, in which a drop ball strength with a 500 g iron ball is 64 cm or more.

10. The chemically strengthened glass according to any one of the above 1 to 9, in which the thickness is 10 mm or less.

11. The chemically strengthened glass according to any one of the above 1 to 10, having a surface roughness (Ra) of 0.20 nm or more, in which a hydrogen concentration Y in a region at a depth X from an outermost surface of the glass satisfies the following relational equation (I) within X=0.1 to 0.4 (μm), and the surface is free of a polishing scratch.

$$Y = aX + b \qquad (I)$$

[Meanings of each symbol in the equation (I) are as follows.
Y: hydrogen concentration (in terms of $H_2O$, mol/L)
X: depth (μm) from outermost surface of glass
a: −0.150 to 0.010
b: 0.000 to 0.220]

12. The chemically strengthened glass according to any one of the above 1 to 11, which is used for an in-vehicle sensor.

13. A production method for a chemically strengthened glass, including: bringing a glass for chemical strengthening having a thickness of more than 2 mm into contact with an inorganic salt composition containing 80 mass % or more of potassium nitrate to perform ion exchange.

14. The production method according to the above 13, in which in the ion exchange, the glass for chemical strengthening is brought into contact with the inorganic salt composition containing 80 mass % or more of potassium nitrate and containing at least one salt selected from the group consisting of $K_2CO_3$, $Na_2CO_3$, $KHCO_3$, $NaHCO_3$, $K_3PO_4$, $Na_3PO_4$, $K_2SO_4$, $Na_2SO_4$, KOH, and NaOH to obtain a chemically strengthened glass, and the production method further includes:
cleaning the chemically strengthened glass after the ion exchange;
subjecting the chemically strengthened glass to an acid treatment after the cleaning; and
subjecting the chemically strengthened glass to an alkali treatment after the acid treatment.

15. The production method according to the above 13 or 14, in which the chemically strengthened glass has a surface compressive stress $CS_0$ of 400 MPa to 1,200 MPa, a depth of compressive stress layer DOL-tail of 2.7 μm to 30.0 μm, an absolute value of an average slope of a stress profile from a surface to a DOL-tail of 20 MPa/μm to 500 MPa/μm, and a tensile stress CT of 1.0 MPa to 16 MPa.

16. The production method according to any one of the above 13 to 15, in which the glass for chemical strengthening is a lithium-containing aluminosilicate glass.

17. The chemically strengthened glass according to any one of the above 1 to 12, in which the thickness is more than 2 mm and 10 mm or less, and the depth of compressive stress layer DOL-tail is 0.03T or less in the case where the thickness is T.

18. The chemically strengthened glass according to any one of the above 1 to 12 and 17, in which the thickness is more than 2 mm and 10 mm or less, and the DOL-tail is 10 μm or less.

19. The chemically strengthened glass according to any one of the above 1 to 12, 17 and 18, in which the tensile stress CT is 1.0 MPa to 4.0 MPa.

20. The chemically strengthened glass according to any one of the above 1 to 12 and 17 to 19, in which the absolute value of the average slope of the stress profile from the surface to the DOL-tail is 50 MPa/μm to 200 MPa/μm.

21. The chemically strengthened glass according to any one of the above 1 to 12 and 17 to 20, in which collision energy measured by a ball drop test with a 500 g iron ball is 3 J or more.

22. The chemically strengthened glass according to any one of the above 1 to 12 and 17 to 21, in which in an ice ball test, the chemically strengthened glass does not crack when colliding with an ice ball having a diameter of 55 mm at a speed of 33.9 m/s, where the ice ball test is performed by the following method:
method: an ice ball is collided with a 100 mm×100 mm glass.

23. The chemically strengthened glass according to any one of the above 1 to 12 and 17 to 22, in which Martens hardness MH when evaluated with PICODENTOR (registered trademark) HM500 is 3,600 N/mm² or more.

24. A solar power generation module including a light receiving surface plate and a solar cell substrate laminated in this order from a light receiving surface side to a back surface side, in which the light receiving surface plate is the chemically strengthened glass according to any one of the above 1 to 7, and
a light receiving surface of the light receiving surface plate has an Sa of 10 nm or less and a gloss (20°) of 100% or more.

25. A solar power generation module including a light receiving surface plate and a solar cell substrate laminated in this order from a light receiving surface side to a back surface side, in which the light receiving surface plate is the chemically strengthened glass according to any one of the above 1 to 7, and
a content of Sn in a range from a surface to a depth of 5 μm on a light receiving surface of the light receiving surface plate is 10 times or more a content of Sn in a range from a surface to a depth of 5 μm on a facing surface against the light receiving surface of the light receiving surface plate.

26. A solar power generation module including a light receiving surface plate and a solar cell substrate laminated in this order from a light receiving surface side to a back surface side, in which the light receiving surface plate is the chemically strengthened glass according to any one of the above 1 to 7, and an absolute value of a difference between $CS_0$ on a light receiving surface of the light receiving surface plate and $CS_0$ on a facing surface against the light receiving surface of the light receiving surface plate is 10 MPa or more.

27. A solar power generation module including: a light receiving surface plate; a solar cell substrate; and a back surface plate laminated in this order from a light receiving surface side to a back surface side, in which the light receiving surface plate is the chemically strengthened glass according to any one of the above 1 to 7, and the back surface plate is made of a glass having a thickness 1 mm or more smaller than a thickness of the light receiving surface plate.

28. The chemically strengthened glass according to any one of the above 1 to 12 and 17 to 23, including: a first main surface; a second main surface facing the first main surface; and an end portion, in which in either the first main surface or the second main surface, one corner among four corners is different in shape, or four corners are different from one another in shape, and the end portion is subjected to C chamfering or R chamfering.

29. A building containing the chemically strengthened glass according to any one of the above 1 to 12 and 17 to 23 as an outer surface member.

Advantageous Effects of Invention

The chemically strengthened glass according to the present invention has a thickness and a stress profile within specific ranges, and in particular, has a CT within a specific range, and therefore exhibits excellent flying stone resistance, drop ball strength, and scratch resistance. With the chemically strengthened glass production method according to the present invention, when a glass for chemical strengthening having a thickness of more than 2 mm is subjected to ion exchanged under specific conditions, it is possible to produce a chemically strengthened glass exhibiting excellent flying stone resistance, drop ball strength, and scratch resistance by setting the CT within a specific range.

BRIEF DESCRIPTION OF DRAWINGS

FIG. 3A and FIG. 3D show measurement results by using an FSM, and FIG. 3B, FIG. 3C, FIG. 3E, and FIG. 3F show measurement results by using an SLP.

FIG. 4 is a diagram showing results of observing samples under a microscope after a flying stone test.

DESCRIPTION OF EMBODIMENTS

Figure 1A:
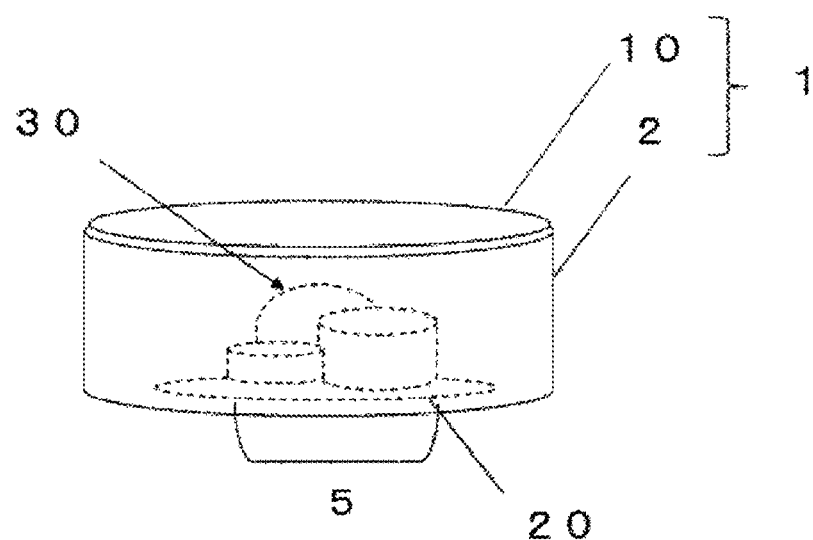
FIG. 1A and FIG. 1B are perspective views showing an example of a configuration of a protective member formed entirely or partially of a chemically strengthened glass according to the present embodiment.

Hereinafter, the present invention is described in detail, but the present invention is not limited to the following embodiment and can be freely modified and implemented without departing from the gist of the present invention.

In the present description, "to" indicating a numerical range is used in the sense of including the numerical values set forth before and after the "to" as a lower limit value and an upper limit value. In the present description, a composition (content of each component) of a glass is expressed as represented by mol % based on oxides, unless otherwise specified.

In the following, a "chemically strengthened glass" refers to a glass after a chemical strengthening treatment, and a "glass for chemical strengthening" refers to a glass before the chemical strengthening treatment.

In the present description, a glass composition is expressed as represented by mol % based on oxides unless otherwise specified, and mol % is simply expressed as "%". In the present description, "not substantially contained" means that a component has a content equal to or less than an impurity level contained in raw materials and the like, that is, the component is not intentionally added. Specifically, the content is, for example, less than 0.1%.

In the present description, a "stress profile" represents a compressive stress value with the depth from a glass surface as a variable. In the stress profile, a tensile stress is expressed as a negative compressive stress.

A "compressive stress (CS)" can be measured by slicing a cross section of a glass and analyzing the sliced sample with a birefringent imaging system. A birefringent imaging system birefringent stress meter is a device for measuring a magnitude of retardation caused by the stress by using a polarization microscope, a liquid crystal compensator, or the like, and for example, there is a birefringent imaging system Abrio-IM manufactured by CRi.

In addition, the measurement may also be performed using scattered light photoelasticity. In this method, light is incident from the glass surface, and polarization of scattered light thereof is analyzed to measure the CS. For example, a scattered light photoelastic stress meter SLP-2000 manufactured by Orihara Industrial Co., Ltd. is used as a stress measurement instrument using the scattered light photoelasticity.

In the present description, a "depth of compressive stress layer (DOC)" is a depth at which the compressive stress value is zero. Hereinafter, the surface compressive stress value may be referred to as $CS_0$. In addition, an "internal tensile stress (CT)" refers to a tensile stress value at a depth of ½ of a thickness t of the glass.

In the present description, a crack occurrence rate is evaluated under the following conditions according to a strength test method in ISO 20567-1 Test Method B.

(Conditions)

Flying stone: chilled iron grit
Stone size: 3.55 mm to 5 mm
Injection amount: 500 g
Injection pressure: 200 kPa
Sample installation angle: 54°
Injection time: 8 s to 12 s
Number of injection: 2
Sample collision area: 40 mm×40 mm <Stress Measurement Method>

In recent years, a glass that has undergone two stages of chemical strengthening by exchanging lithium ions inside the glass with sodium ions (Li—Na exchange), and then exchanging the sodium ions inside the glass with potassium ions (Na—K exchange) on a surface layer portion of the glass has become mainstream for a cover glass of a smartphone and the like.

In order to acquire a stress profile of such a two-stage chemically strengthened glass in a non-destructive manner, for example, a scattered light photoelastic stress meter (hereinafter also abbreviated as an SLP), a film stress measurement (hereinafter also abbreviated as an FSM), or the like may be used in combination.

In a method using the scattered light photoelastic stress meter (SLP), a compressive stress derived from the Li—Na exchange can be measured inside the glass at a depth of several tens of μm or more from a glass surface layer. On the other hand, in a method using the film stress measurement (FSM), the compressive stress derived from the Na—K exchange can be measured in a surface layer portion of the glass, which is at a depth of several tens of μm or less from the glass surface (for example, WO 2018/056121 and WO 2017/115811). Therefore, as a stress profile in the glass surface layer and inside of the two-stage chemically strengthened glass, a combination of SLP information and FSM information is sometimes used.

In the present invention, the stress profile measured by the scattered light photoelastic stress meter (SLP) is mainly used. Note that, in the present description, a compressive stress value CS2, the tensile stress CT, the depth of compressive stress layer DOC, or the like means a value in the SLP stress profile.

The scattered light photoelastic stress meter is a stress measuring device including: a polarization phase difference variable member that changes a polarization phase difference of laser light by one wavelength or more with respect to a wavelength of the laser light; an imaging element that acquires a plurality of images by imaging, a plurality of times at predetermined time intervals, scattered light emitted when the laser light having the variable polarization phase difference is incident on a strengthened glass; and a calculation unit that measures a periodic luminance change of the scattered light using the plurality of images, calculates a phase change of the luminance change, and calculates a stress distribution in a depth direction from a surface of the strengthened glass based on the phase change.

A method for measuring the stress profile by using the scattered light photoelastic stress meter includes a method described in WO 2018/056121. Examples of the scattered light photoelastic stress meter include SLP-1000 and SLP-2000 manufactured by Orihara Industrial Co., Ltd. A combination of attached software SlpIV_up3 (Ver. 2019.01.10.001) with these scattered light photoelastic stress meters enables highly accurate stress measurement.

In the present description, an average slope of the stress profile refers to an average value of slopes obtained by determining the slope of the stress profile every 1 μm in a depth range for which the slope is determined, in a stress profile with the horizontal axis representing the depth from the glass surface and the vertical axis representing the compressive stress.

<Chemically Strengthened Glass>
<<Stress Profile>>

A chemically strengthened glass according to the present embodiment (hereinafter also abbreviated as "the present chemically strengthened glass") has a thickness of more than 2 mm, in which a surface compressive stress $CS_0$ is 400 MPa to 1,200 MPa, a depth of compressive stress layer DOL-tail is 2.7 μm to 30.0 μm, an absolute value of an average slope of a stress profile from a surface to a DOL-tail is 20 MPa/μm to 500 MPa/μm, and a tensile stress CT is 1.0 MPa to 16 MPa. Note that, in the present description, the DOL-tail means the depth of compressive stress layer (μm) measured by using an FSM. In addition, "to the DOL-tail", "to the DOC", and "to a thickness center portion" mean to include the DOL-tail, the DOC, and the thickness center portion, respectively.

The thickness of the present chemically strengthened glass is more than 2 mm, preferably 2.5 mm or more, more preferably 3 mm or more, still more preferably 4 mm or more, and particularly preferably 5 mm or more. When the thickness is more than 2 mm, the strength is improved and excellent flying stone resistance is exhibited. In addition, the thickness is preferably 10 mm or less, 9 mm or less, 8 mm or less, and 7 mm or less in order, more preferably 6.6 mm or less, still more preferably 6.2 mm or less, and particularly preferably 5.8 mm or less, from the viewpoint of achieving weight reduction.

The surface compressive stress $CS_0$ of the present chemically strengthened glass is preferably 400 MPa or more, more preferably 500 MPa or more, still more preferably 550 MPa or more, and particularly preferably 600 MPa or more, from the viewpoint of improving bending strength. In addition, the surface compressive stress $CS_0$ is preferably 1,200 MPa or less, more preferably 1,150 MPa or less, and still more preferably 1,100 MPa or less, from the viewpoint of achieving balance between the compressive stress and the tensile stress.

The depth of compressive stress layer DOL-tail of the present chemically strengthened glass is 2.7 μm or more, preferably 3.0 μm or more, more preferably 4.5 μm or more, and particularly preferably 6.0 μm or more. The DOL-tail is 30.0 μm or less, preferably 25.0 μm or less, more preferably 20.0 μm or less, still more preferably 15.0 μm or less, particularly preferably 10.0 μm or less, and most preferably 6.0 μm or less. When the DOL-tail is 2.7 μm or more and 30.0 μm or less, excellent flying stone resistance, drop ball strength, and scratch resistance are exhibited.

In the present chemically strengthened glass, from the viewpoint of further improving the drop ball strength, the thickness T is more than 2 mm and 10 mm or less, and the depth of compressive stress layer DOL-tail is preferably 0.03T or less, more preferably 0.02T or less, still more preferably 0.01T or less, and particularly preferably 0.005T or less in the case where the thickness is T.

In the present chemically strengthened glass, the absolute value of the average slope of the stress profile from the surface to the DOL-tail (hereinafter also abbreviated as a surface layer slope) is 20 MPa/μm or more, preferably 30 MPa/μm or more, more preferably 40 MPa/μm or more, still more preferably 50 MPa/μm or more, and particularly preferably 100 MPa/μm or more. The absolute value of the average slope is 500 MPa/μm or less, preferably 400 MPa/μm or less, more preferably 350 MPa/μm or less, still more preferably 300 MPa/μm or less, particularly preferably 250 MPa/μm or less, and most preferably 200 MPa/μm or less. When the absolute value of the surface layer slope is 20 MPa/μm or more and 500 MPa/μm or less, excellent flying stone resistance, drop ball strength, and scratch resistance are exhibited. In addition, when the absolute value of the surface layer slope is 50 MPa/μm or more and 200 MPa/μm or less, more excellent drop ball strength is exhibited.

Figure 2:
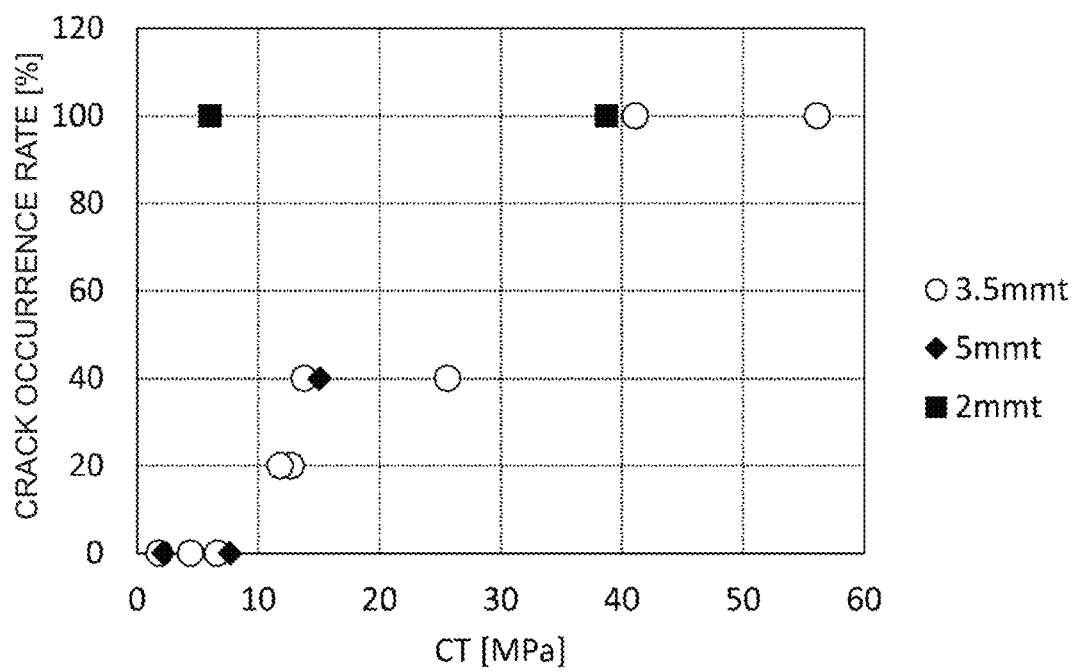
FIG. 2 is a diagram showing a correlation between a tensile stress CT and flying stone resistance.

The tensile stress CT of the present chemically strengthened glass is 1.0 MPa or more, preferably 1.5 MPa or more, more preferably 2.0 MPa or more, and still more preferably 2.5 MPa or more. The tensile stress CT is 16 MPa or less, preferably 13 MPa or less, more preferably 10 MPa or less, still more preferably 5.0 MPa or less, and particularly preferably 4.0 MPa or less. As shown in FIG. 2, when the thickness is more than 2 mm, there is a correlation between the CT and the flying stone resistance. When the tensile stress is 1.0 MPa or more and 16 MPa or less, excellent flying stone resistance, drop ball strength, and scratch resistance are exhibited. In addition, when the tensile stress is 1.0 MPa or more and 4.0 MPa or less, more excellent drop ball strength is exhibited.

In the present chemically strengthened glass, an absolute value of an average slope of the stress profile from a position 50 μm from the surface to the DOC (hereinafter abbreviated as a deep layer slope) is preferably 0.00 MPa/μm or more, more preferably 0.02 MPa/μm or more, still more preferably 0.04 MPa/μm or more, and particularly preferably 0.06 MPa/μm or more. The absolute value of the deep layer slope is preferably 0.90 MPa/μm or less, more preferably 0.80 MPa/μm or less, still more preferably 0.70 MPa/μm or less, and particularly preferably 0.60 MPa/μm or less. When the absolute value of the deep layer slope is 0.00 MPa/μm or more and 0.90 MPa/μm or less, the flying stone resistance, the drop ball strength, and the scratch resistance can be further improved.

In the present chemically strengthened glass, an absolute value of an average slope of the stress profile from a depth 400 μm from the surface to the thickness center portion is preferably 0.010 MPa/μm or less, more preferably 0.008 MPa/μm or less, still more preferably 0.006 MPa/μm or less, and particularly preferably 0.005 MPa/μm or less. The absolute value of the average slope is not particularly limited in lower limit, and is preferably 0.000 MPa/μm or more. When the absolute value of the average slope from a depth of 400 μm to the thickness center portion is 0.000 MPa/μm or more and 0.010 MPa/μm or less, the flying stone resistance, the drop ball strength, and the scratch resistance can be further improved.

In the present chemically strengthened glass, a difference between an average concentration of Na from a depth of 25 μm to 30 μm from the surface and a concentration of Na at the thickness center portion is preferably 1% or less as represented by mol % based on oxides. The difference is more preferably 0.9% or less, still more preferably 0.8% or less, and particularly preferably 0.7% or less. The difference is not particularly limited in lower limit, and is preferably, for example, 0.02% or more. When the difference is 1.0% or less, the flying stone resistance, the drop ball strength, and the scratch resistance can be further improved. The concentration of Na can be measured by a known method using EPMA.

An integrated value ICT (MPa·μm) of the tensile stress of the present chemically strengthened glass is preferably 20,000 or less, more preferably 18,000 or less, and still more preferably 16,000 or less. When the integrated value ICT (MPa·μm) of the tensile stress is 20,000 or less, energy that contributes to crack propagation can be reduced, so that the flying stone resistance, the drop ball strength, and the scratch resistance can be further improved. The integrated value ICT (MPa·μm) of the tensile stress is preferably 500 or more, more preferably 1,000 or more, still preferably 2,000 or more, and particularly preferably 3,000 or more, from the viewpoint of improving the strength. The integrated value ICT of the tensile stress refers to an integrated value of the tensile stress in a region deeper than the DOC.

It is preferable that the present chemically strengthened glass includes a first main surface, a second main surface facing the first main surface, and an end portion, in which on either the first main surface or the second main surface, one corner among four corners is different in shape, or four corners are different from one another in shape, and the end portion is subjected to C chamfering or R chamfering. By having such a shape, in the case of using the present chemically strengthened glass as a member of a solar power generation module or the like, it has the advantage that a light receiving surface can be easily identified, and the production efficiency can be improved.

(Hydrogen Concentration and Surface Roughness)

It is preferable that, in the present chemically strengthened glass, a surface roughness (Ra) is 0.20 nm or more, and a hydrogen concentration Y in a region at a depth X from an outermost surface of the glass satisfies the following relational equation (I) within X=0.1 to 0.4 (μm), and the surface is free of a polishing scratch.

$$Y = aX + b \quad (I)$$

[Meanings of each symbol in the equation (I) are as follows.

Y: hydrogen concentration (in terms of $H_2O$, mol/L)
X: depth (μm) from outermost surface of glass
a: −0.150 to 0.010
b: 0.000 to 0.220]

When the hydrogen concentration in the glass is high, hydrogen enters a Si—O—Si bond network of the glass in the form of Si—OH, breaking the Si—O—Si bond. It is thought that when the hydrogen concentration in the glass is high, the number of broken Si—O—Si bonds increases, chemical defects are more likely to occur, and the strength decreases.

In the above relational equation (I) holds true in a region of a depth X of 0.1 μm to 0.4 μm from the outermost surface. The thickness of the compressive stress layer formed by ion exchange is in a range of 5 μm to 50 μm, depending on the degree of the chemical strengthening. The depth at which hydrogen penetrates the glass depends on a diffusion coefficient, a temperature, and a time, and the amount of hydrogen that penetrates is influenced by these factors and the amount of moisture in the atmosphere. The hydrogen concentration after the chemical strengthening is highest at the outermost surface and gradually decreases toward a deeper portion (bulk) where no compressive stress layer is formed. The above relational equation (I) defines the degree of decrease, but since the moisture concentration at the outermost surface (X=0 μm) may change due to deterioration over time, the equation holds true in a near-surface region (X=0.1 μm to 0.4 μm) which is thought to have no influence.

In the equation (I), a is a slope that defines the degree of decrease in hydrogen concentration. The range of a is −0.150 to 0.010, preferably −0.100 to 0.010, and more preferably −0.050 to 0.010.

In the equation (I), b corresponds to the hydrogen concentration at the outermost surface (X=0 μm). The range of b is 0.000 to 0.220, preferably 0.000 to 0.215, more preferably 0.010 to 0.150, and still more preferably 0.010 to 0.100.

[Method for Measuring Hydrogen Concentration Profile]

Here, a hydrogen concentration profile (concentration of $H_2O$, mol/L) of the glass is a profile measured under the following analytical conditions.

A secondary ion mass spectrometry (SIMS) is used to measure the hydrogen concentration profile of a glass substrate. In the case of obtaining a quantitative hydrogen concentration profile by the SIMS, a standard sample having a known hydrogen concentration is required. A method for preparing the standard samples and a method for quantifying the hydrogen concentration are described below.

1) A part of the glass substrate to be measured is cut out.

2) A region of 50 μm or more from the surface of the cut glass substrate is removed by polishing or chemical etching. The removal treatment is performed on both surfaces. That is, the thickness removed on both surfaces is 100 μm or more. The glass substrate after the removal treatment is used as the standard sample.

3) Infrared spectroscopy (IR) is performed on the standard sample, and an absorbance height $A_{3550}$ of a peak top near 3550 $cm^{-1}$ and an absorbance height $A_{4000}$ (baseline) at 4000 $cm^1$ in the IR spectrum are determined.

4) A thickness d (cm) of the standard sample is measured using a thickness measuring device such as a micrometer.

5) With reference to Literature A, a practical infrared absorption coefficient $\varepsilon_{pract}$(L/(mol·cm)) of $H_2O$ in the glass is set to 75, and the hydrogen concentration (in terms of $H_2O$, mol/L) of the standard sample is calculated using an Equation II.

$$\text{Hydrogen concentration of standard sample} = (A_{3550} - A_{4000})/(\varepsilon_{pract} \cdot d) \quad \text{Equation II}$$

Literature A) S. lievski et al., Glastech. Ber. Glass Sci. Technol., 73 (2000) 39.

The glass substrate to be measured and the standard sample having a known hydrogen concentration obtained by the above method are simultaneously transferred into the SIMS device, and measurements are successively performed to obtain profiles of $^1H^-$ and $^{30}Si^-$ intensities in the depth direction. Thereafter, the $^1H^-$ profile is divided by the $^{30}Si^-$ profile to obtain a $^1H^-/^{30}Si^-$ intensity ratio profile in the depth direction. Based on the $^1H^-/^{30}Si^-$ intensity ratio profile in the depth direction of the standard sample, an average $^1H^-/^{30}Si^-$ intensity ratio in a region from a depth of 1 μm to 2 μm is calculated, and a calibration curve of this value versus the hydrogen concentration is created to pass through the origin (calibration curve for one level standard sample). Using this calibration curve, the $^1H^-/^{30}Si^-$ intensity ratio on the vertical axis of the profile of the glass substrate to be measured is converted into the hydrogen concentration. Accordingly, the hydrogen concentration profile of the glass substrate to be measured is obtained. Note that, the measurement conditions for the SIMS and the IR are as follows.

[Measurement Conditions for SIMS]
Device: ADEPT 1010 manufactured by ULVAC-PHI, Inc.
Primary ion species: $Cs^+$
Acceleration voltage for primary ion: 5 kV
Current value for primary ion: 500 nA
Incident angle of primary ion: 60° to normal of sample surface
Raster size of primary ion: 300×300 $\mu m^2$
Polarity of secondary ion: negative
Detection region of secondary ion: 60×60 $\mu m^2$ (4% of Raster size of primary ion)
ESA input lens: 0
Use of neutralizing gun: yes Method of converting horizontal axis from sputtering time to depth: The depth of an analysis crater is measured by a stylus surface profiler (Dektak 150 manufactured by Veeco Instruments Inc.) to determine a sputtering rate of the primary ion. This sputtering rate is used to convert the horizontal axis from the sputtering time to the depth.

Field axis potential during detection of $^1H^-$: The optimum value may vary from device to device. An operator carefully sets the value such that the background is sufficiently cut off.

[Measurement Conditions for IR]
Device: Nic-plan/Nicolet 6700 manufactured by Thermo Fisher Scientific Inc.
Resolution: 4 $cm^{-1}$
Integration: 16
Detector: TGS detector The relational equation [I] can be derived from the hydrogen concentration profile (concentration of $H_2O$, mol/L) of the glass measured under the above analytical conditions by the following procedure. A linear approximation is performed on the hydrogen concentration profile in a depth region from 0.1 μm to 0.4 μm. The obtained approximation line equation is taken as the relational equation [I]. In addition, examples of means for controlling a and b include changing a flux concentration, a sodium concentration, a temperature, a time, or the like in the ion exchange step.

The present chemically strengthened glass preferably has a surface roughness (Ra) of 0.20 nm or more. When the surface roughness is equal to or greater than the above value, it is possible to obtain a chemically strengthened glass having high surface strength. It is presumed that when the glass surface has a certain degree of surface roughness, stress concentration is prevented and the strength is improved.

The surface roughness can be measured, for example, by AFM surface observation in a measurement range of 1 μm×1 μm.

Note that, the surface roughness of an unpolished chemically strengthened glass plate in the related art is less than 0.20 nm.

[Measurement Conditions for AFM]
Device: Nanoscope V+MultiMode 8 or Dimension ICON manufactured by Bruker Corporation
Mode: ScanAsyst mode
Probe: RTESPA (spring constant: 40 N/m)
Samples/line: 256
Lines: 256
Scan rate: 1 Hz
Measurement field of view: 1×1 $\mu m^2$ (targeting region without contamination)

The present chemically strengthened glass is preferably free of a polishing scratch on the surface. Here, in the present embodiment, polishing refers to smoothing the glass surface by scraping the same with abrasive grains. In addition, the presence or absence of the polishing scratch can be determined by observing the surface with an atomic force microscope (AFM), and in the case where two or more scratches having a length of 5 μm or more and a width of 0.1 μm or more are not present within a region of 10 μm×5 μm, it can be said that the surface is free of the polishing scratch.

<<Crack Occurrence Rate>>

In the present chemically strengthened glass, a crack occurrence rate evaluated according to a strength test method in ISO 20567-1 Test Method B is preferably 20% or less, more preferably 18% or less, still more preferably 15% or less, and particularly preferably 13% or less. When the crack occurrence rate is 20% or less, the flying stone resistance can be more effectively improved. In the case of determining the crack occurrence rate, n is 3 or more.

In the present chemically strengthened glass, a scratch area measured according to the strength test method in ISO 20567-1 Test Method B using the following method is preferably 6% or less, more preferably 5.5% or less, and still more preferably 5% or less.

(Method)
Measurement range: a range of 35 mm×35 mm in a center of a sample
Image capture: Using a digital microscope (for example, VHX-5000 manufactured by Keyence Corporation), images of the sample after a flying stone test are captured under a coaxial epi-illumination light source.
Extraction and area of scratch: Using a digital microscope (for example, VHX-5000 manufactured by Keyence Corporation), the captured image is binarized using luminance to extract scratches on the sample surface, and a total area of the scratches is divided by an area of the measurement range to obtain the scratch area.

<<Drop Ball Strength>>

In the present chemically strengthened glass, drop ball strength with a 500 g iron ball measured by the following measurement test is preferably 20 cm or more, more preferably 40 cm or more, still more preferably 60 cm or more, particularly preferably 64 cm or more, and most preferably 80 cm or more. The higher the drop ball strength, the more preferred. There is no particular limit in upper limit.

Measurement test: A test is performed by dropping a 500 g iron ball onto a glass substrate having a thickness of 2.0 mm or more and made of the above chemically strengthened glass, and gradually increasing the drop height until the glass substrate breaks. The drop height at which the glass substrate breaks is measured, and an average value of crack heights of five test pieces is taken as the drop ball strength.

In the present chemically strengthened glass, collision energy measured by a ball drop test with a 500 g iron ball by the above measurement test is preferably 3 J or more, more preferably 4 J or more, and still more preferably 5 J or more. The higher the energy, the more preferred.

In the present chemically strengthened glass, energy at which breaking occurs in an ice ball test is preferably 46 J or more, more preferably 89 J or more, still more preferably 158 J or more, and particularly preferably 261 J or more. The higher the impact energy with the ice ball, the more preferred. There is no particular limit in upper limit. The ice ball test is performed according to JIS C61215 (2020) by the following method.

Test method: an ice ball is collided with a 100 mm×100 mm glass.

In an embodiment, it is preferable that, in the ice ball test, the present chemically strengthened glass does not crack even when colliding with an ice ball having a diameter of 55 mm at a speed of 33.9 m/s. In an embodiment, it is preferable that, in the ice ball test, the present chemically strengthened glass does not crack even when colliding with an ice ball having a diameter of 65 mm at a speed of 36.7 m/s. In an embodiment, it is preferable that, in the ice ball test, the present chemically strengthened glass does not crack even when colliding with an ice ball having a diameter of 75 mm at a speed of 39.5 m/s.

<<Breaking Strength>>

Figure 5:
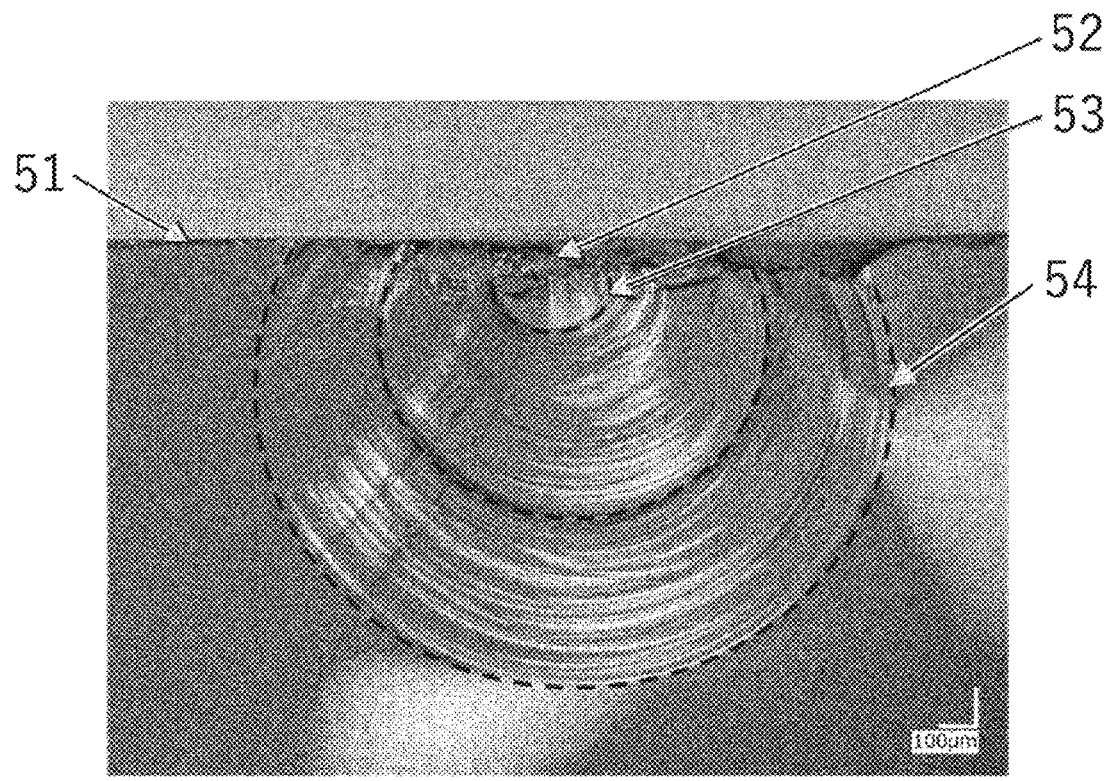
FIG. 5 is a diagram showing arrest lines generated on a broken surface of a sample after a flying stone test.

Breaking strength of the present chemically strengthened glass can be defined as a maximum value of an arrest line or a difference between the maximum value of the arrest line and a minimum value of the arrest line. The arrest line is a pattern created when the progression of breaking is temporarily halted, and the arrest line can be confirmed by observing the broken surface of a broken sample. FIG. 5 is a diagram showing arrest lines generated on a fracture surface of a sample after a flying stone test. In FIG. 5, a position where the flying stone collides with a sample surface 51 is denoted as a collision point 52, the arrest line is denoted by a dashed line, the minimum value of the arrest line is denoted as a minimum arrest line 53, and the maximum value of the arrest line is denoted as a maximum arrest line 54.

As shown by the dashed line in FIG. 5, as the crack repeatedly propagates and stops propagating, a plurality of arrest lines are generated. The arrest line value is measured as a distance from the glass surface perpendicular to a cut surface of the glass to the arrest line generated at a farthest position.

The breaking strength can also be defined as a difference between the maximum value of the arrest line and a maximum crack depth. For the maximum crack depth, crack depths of cut surfaces of a plurality of uncracked chemically strengthened glasses are measured, and the average value is taken as the maximum crack depth (n≥3). That is, it can be said that the greater the difference between the maximum value of the arrest line and the maximum crack depth, the greater the margin before the breaking occurs. Hereinafter, the maximum value of the arrest line is referred to as a maximum arrest line depth, and the minimum value of the arrest line is referred to as a minimum arrest line depth.

<<Martens Hardness MH>>

In the present chemically strengthened glass, Martens hardness MH when evaluated with PICODENTOR (registered trademark) HM500 is preferably 3,600 N/mm$^2$ or more, more preferably 3,700 N/mm$^2$ or more, and still more preferably 3,750 N/mm$^2$ or more. From the viewpoint of resistance to scratches, the higher the Martens hardness MH, the more preferred.

<<Glass Composition>>

In the present description, a "base composition of the chemically strengthened glass" is a glass composition of a glass for chemical strengthening, and except for the case where an extreme ion exchange treatment is performed, the glass composition of a deeper portion than the depth of compressive stress layer of the chemically strengthened glass is substantially the same as the base composition of the chemically strengthened glass.

The chemically strengthened glass according to the present embodiment preferably has a base composition containing, as represented by mol % based on oxides, 52% to 75% of $SiO_2$, 1% to 20% of $Al_2O_3$, and 1% to 20% of $Na_2O$.

More preferably, the chemically strengthened glass according to the present embodiment has a base composition containing, as represented by mol % based on oxides, 52% to 75% of $SiO_2$, 1% to 20% of $Al_2O_3$, 0% to 18% of $Li_2O$, 1% to 20% of $Na_2O$, 0% to 5% of $K_2O$, 0% to 20% of MgO, 0% to 20% of CaO, 0% to 20% of SrO, 0% to 20% of BaO, 0% to 10% of ZnO, 0% to 1% of $TiO_2$, 0% to 8% of $ZrO_2$, and 0% to 5% of $Y_2O_3$.

Hereinafter, preferred glass compositions are described.

In the glass for chemical strengthening in the present embodiment, $SiO_2$ is a component that forms a network structure of the glass. It is also a component that improves the chemical durability. The content of $SiO_2$ is preferably 52% or more, more preferably 56% or more, still more preferably 60% or more, and particularly preferably 64% or more. On the other hand, the content of $SiO_2$ is preferably 75% or less, more preferably 73% or less, still more preferably 71% or less, and particularly preferably 69% or less in order to improve the meltability.

$Al_2O_3$ is a component that increases the surface compressive stress due to chemical strengthening and is essential. The content of $Al_2O_3$ is preferably 1% or more, more preferably 2% or more, still more preferably 4% or more, and particularly preferably 6% or more. On the other hand, the content of $Al_2O_3$ is preferably 20% or less, more preferably 18% or less, still more preferably 17% or less and 16% or less in order, and most preferably 15% or less in order to prevent the devitrification temperature of the glass from being too high.

$Na_2O$ is a component that improves the meltability of the glass and that forms the surface compressive stress by ion exchange. The content of $Na_2O$ is preferably 1% or more, more preferably 2% or more, and particularly preferably 4% or more. When the content of $Na_2O$ is too large, the chemical strengthening properties decrease, and therefore, the content of $Na_2O$ is preferably 20% or less, more preferably 18% or less, particularly preferably 16% or less, and most preferably 14% or less.

Similar to $Na_2O$, $K_2O$ is a component that lowers the melting temperature of the glass and that forms the surface compressive stress by ion exchange. In the case where $K_2O$ is contained, the content thereof is preferably 0% or more, more preferably 0.1% or more, still more preferably 0.3% or more, even more preferably 0.4% or more, and particularly preferably 0.5% or more. When the content of $K_2O$ is too large, the chemical strengthening properties decrease or the chemical durability decreases, and therefore, the content thereof is preferably 5% or less, more preferably 4.8% or less, still more preferably 4.5% or less, particularly preferably 4.2% or less, and most preferably 4.0% or less.

The total content of $Na_2O$ and $K_2O$, that is, $Na_2O+K_2O$, is preferably 1% or more, and more preferably 2% or more, from the viewpoint of improving the meltability of the glass raw material and forming the surface compressive stress by ion exchange.

$Li_2O$ is a component that forms the surface compressive stress by ion exchange. When $Li_2O$ is contained, the content thereof is preferably 1% or more, more preferably 2% or more, still more preferably 4% or more, and particularly preferably 5% or more. On the other hand, the content of $Li_2O$ is preferably 18% or less, more preferably 17% or less, still more preferably 16% or less, and most preferably 15% or less in order to stabilize the glass.

The ratio of the content of $K_2O$ to the total content of $Li_2O$, $Na_2O$, and $K_2O$ (hereinafter, $R_2O$), that is, $K_2O/R_2O$, is preferably 0.2 or less since the chemical strengthening properties can be improved and the chemical durability can be improved. The $K_2O/R_2O$ is more preferably 0.15 or less, and still more preferably 0.10 or less. Note that, $R_2O$ is preferably 10% or more, more preferably 12% or more, and still more preferably 15% or more. In addition, $R_2O$ is preferably 20% or less, and more preferably 18% or less.

MgO is a component that stabilizes the glass and is also a component that improves the mechanical strength and the chemical resistance, and is thus preferably contained in the case where the content of $Al_2O_3$ is relatively small. The content of MgO is preferably 1% or more, more preferably 2% or more, still more preferably 3% or more, and particularly preferably 4% or more. On the other hand, when too many MgO is added, the viscosity of the glass is lowered, and the devitrification or the phase separation is likely to occur. The content of MgO is preferably 20% or less, more preferably 19% or less, still more preferably 18% or less, and particularly preferably 17% or less.

CaO, SrO, BaO, and ZnO are all components that improve the meltability of the glass, and may be contained.

CaO is a component that improves the meltability of the glass and is a component that reduces the crushability of the chemically strengthened glass, and may be contained. In the case where CaO is contained, the content thereof is preferably 0.5% or more, more preferably 1% or more, still more preferably 2% or more, particularly preferably 3% or more, and most preferably 5% or more. On the other hand, when the content of CaO is more than 20%, the ion exchange performance remarkably decreases, so that the content is preferably 20% or less. The content of CaO is more preferably 14% or less, and still more preferably 10% or less, 8% or less, 6% or less, 3% or less, and 1% or less, in a stepwise manner.

SrO is a component that improves the meltability of the glass and is a component that reduces the crushability of the chemically strengthened glass, and may be contained. In the case where SrO is contained, the content thereof is preferably 0.5% or more, more preferably 1% or more, still more preferably 2% or more, particularly preferably 3% or more, and most preferably 5% or more. On the other hand, when the content of SrO is more than 20%, the ion exchange performance remarkably decreases, so that the content is preferably 20% or less. The content of SrO is more preferably 14% or less, and still more preferably 10% or less, 8% or less, 6% or less, 3% or less, and 1% or less, in a stepwise manner.

BaO is a component that improves the meltability of the glass and is a component that reduces the crushability of the chemically strengthened glass, and may be contained. In the case where BaO is contained, the content thereof is preferably 0.5% or more, more preferably 1% or more, still more preferably 2% or more, particularly preferably 3% or more, and most preferably 5% or more. On the other hand, when the content of BaO is more than 20%, the ion exchange performance remarkably decreases. The content of BaO is preferably 20% or less, and more preferably 15% or less, 10% or less, 6% or less, 3% or less, and 1% or less, in a stepwise manner.

ZnO is a component that improves the meltability of the glass, and may be contained. In the case where ZnO is contained, the content thereof is preferably 0.25% or more, and more preferably 0.5% or more. On the other hand, when the content of ZnO is more than 10%, the weather resistance of the glass remarkably decreases. The content of ZnO is more preferably 10% or less, and still more preferably 8% or less. 6% or less, 3% or less, and 1% or less, in a stepwise manner.

$ZrO_2$ is a component that improves the mechanical strength and the chemical durability and remarkably increases the CS, and is preferably contained. The content of $ZrO_2$ is preferably 0.5% or more, more preferably 0.7% or more, still more preferably 1.0% or more, particularly preferably 1.2% or more, and most preferably 1.5% or more. On the other hand, the content of $ZrO_2$ is preferably 8% or less, more preferably 7.5% or less, still more preferably 7% or less, and particularly preferably 6% or less in order to prevent the devitrification during melting. When the content of $ZrO_2$ is too large, the devitrification temperature rises and thereby the viscosity decreases. In the case where the forming viscosity is low, the content of $ZrO_2$ is preferably 5% or less, more preferably 4.5% or less, and still more preferably 3.5% or less in order to prevent deterioration of the formability due to such a decrease in viscosity.

$ZrO_2/R_2O$ is preferably 0.02 or more, more preferably 0.04 or more, still more preferably 0.06 or more, particularly preferably 0.08 or more, and most preferably 0.1 or more in order to improve the chemical durability. The $ZrO_2/R_2O$ is preferably 0.2 or less, more preferably 0.18 or less, still more preferably 0.16 or less, and particularly preferably 0.14 or less.

$TiO_2$ is not essential, but in the case where it is contained, the content thereof is preferably 0.05% or more, and more preferably 0.1% or more. On the other hand, the content of $TiO_2$ is preferably 1% or less, more preferably 0.5% or less, and still more preferably 0.3% or less in order to prevent the devitrification during melting.

$SnO_2$ is not essential, and but in the case where it is contained, the content thereof is preferably 0.5% or more, more preferably 1% or more, still more preferably 1.5% or more, and particularly preferably 2% or more. On the other hand, the content of $SnO_2$ is preferably 4% or less, more preferably 3.5% or less, still more preferably 3% or less, and particularly preferably 2.5% or less in order to prevent the devitrification during melting.

$Y_2O_3$ is a component that has an effect of preventing fragments from scattering when the chemically strengthened glass breaks, and may be contained. The content of $Y_2O_3$ is preferably 0.3% or more, more preferably 0.5% or more, still more preferably 0.7% or more, and particularly preferably 1.0% or more. On the other hand, the content of $Y_2O_3$ is preferably 5% or less, and more preferably 4% or less in order to prevent the devitrification during melting.

$B_2O_3$ is a component that improves the chipping resistance of the glass for chemical strengthening or the chemically strengthened glass and that improves the meltability, and may be contained. In the case where $B_2O_3$ is contained, the content thereof is preferably 0.5% or more, more preferably 1% or more, and still more preferably 2% or more in order to improve the meltability. On the other hand, when the content of $B_2O_3$ is too large, striae may be generated during melting or the phase separation is likely to occur, and the quality of the glass for chemical strengthening is likely to decrease, so that the content thereof is preferably 10% or less. The content of $B_2O_3$ is more preferably 8% or less, still more preferably 6% or less, and particularly preferably 4% or less.

$La_2O_3$, $Nb_2O_5$, and $Ta_2O_5$ are all components that prevent fragments from scattering when the chemically strengthened glass breaks, and may be contained in order to increase the refractive index. In the case where these components are contained, the total content of $La_2O_3$, $Nb_2O_5$, and $Ta_2O_5$ (hereinafter, $La_2O_3+Nb_2O_5+Ta_2O_5$) is preferably 0.5% or more, more preferably 1% or more, still more preferably 1.5% or more, and particularly preferably 2% or more. In addition, the $La_2O_3+Nb_2O_5+Ta_2O_5$ is preferably 4% or less, more preferably 3% or less, still more preferably 2% or less, and particularly preferably 1% or less in order to prevent the devitrification of the glass during melting.

In addition, $CeO_2$ may be contained. $CeO_2$ may prevent coloring by oxidation of the glass. In the case where $CeO_2$ is contained, the content thereof is preferably 0.03% or more, more preferably 0.05% or more, and still more preferably 0.07% or more. The content of $CeO_2$ is preferably 1.5% or less, and more preferably 1.0% or less in order to improve the transparency.

When the chemically strengthened glass is colored and used, a coloring component may be added within a range that does not impede achievement of desired chemical strengthening properties. Examples of the coloring component include $Co_3O_4$, $MnO_2$, $Fe_2O_3$, NiO, CuO, $Cr_2O_3$, $V_2O_5$, $Bi_2O_3$, $SeO_2$, $Er_2O_3$, and $Nd_2O_3$.

The total content of the coloring component is preferably in a range of 1% or less. When it is desired to further increase the visible light transmittance of the glass, these components are preferably not substantially contained.

$HfO_2$, $Nb_2O_5$, and $Ti_2O_3$ may be added in order to improve the weather resistance against ultraviolet light irradiation. In the case where $HfO_2$, $Nb_2O_5$, and $Ti_2O_3$ are added for the purpose of improving the weather resistance against ultraviolet light irradiation, the total content thereof is preferably 1% or less, more preferably 0.5% or less, and still more preferably 0.1% or less in order to reduce influences on other properties.

$SO_3$, a chloride, and a fluoride may be appropriately contained as a refining agent or the like during melting of the glass. The total content of components that function as a refining agent is, as represented by mass % based on oxides, preferably 2% or less, more preferably 1% or less, and still more preferably 0.5% or less since the strengthening properties may be influenced when added too much. The total content is not particularly limited in lower limit, and is typically preferably 0.05% or more as represented by mass % based on oxides.

In the case where $SO_3$ is used as the refining agent, the content of $SO_3$ is, as represented by mass % based on oxides, preferably 0.01% or more, more preferably 0.05% or more, and still more preferably 0.1% or more since the effect cannot be obtained when the content is too small. In addition, in the case where $SO_3$ is used as the refining agent, the content of $SO_3$ is, as represented by mass % based on oxides, preferably 1% or less, more preferably 0.8% or less, and still more preferably 0.6% or less.

In the case where Cl is used as the refining agent, the content of Cl is, as represented by mass % based on oxides, preferably 1% or less, more preferably 0.8% or less, and still more preferably 0.6% or less since physical properties such as the strengthening properties may be influenced when added too much. In addition, in the case where Cl is used as the refining agent, the content of Cl is, as represented by mass % based on oxides, preferably 0.05% or more, more preferably 0.1% or more, and still more preferably 0.2% or more since the effect cannot be obtained when the content is too small.

In the case where $SnO_2$ is used as the refining agent, the content of $SnO_2$ is, as represented by mass % based on oxides, preferably 1% or less, more preferably 0.5% or less, and still more preferably 0.3% or less. In addition, in the case where $SnO_2$ is used as the refining agent, the content of $SnO_2$ is, as represented by mass % based on oxides, preferably 0.02% or more, more preferably 0.05% or more, and still more preferably 0.1% or more since the effect cannot be obtained when the content is too small.

$P_2O_5$ is preferably not contained. In the case where $P_2O_5$ is contained, the content thereof is preferably 2.0% or less, and more preferably 1.0% or less, and it is most preferably that $P_2O_5$ is not contained.

$As_2O_3$ is preferably not contained. In the case where $Sb_2O_3$ is contained, the content thereof is preferably 0.3% or less, and more preferably 0.1% or less, and it is most preferably that $Sb_2O_3$ is not contained.

<<Use>>

Figure 1B:
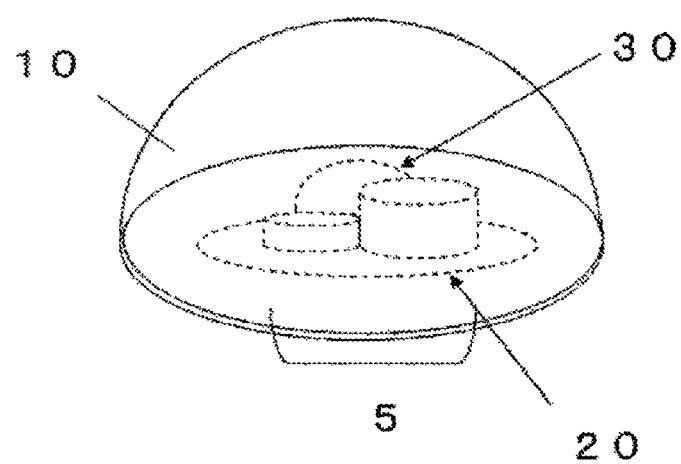

Examples of the use of the present chemically strengthened glass include a protective member for a sensor mounted on moving devices such as a car and a drone, an outdoor sensor, and a sensor mounted on a surveillance camera, a light receiving surface plate of a solar power generation module, and an outer surface member of a building. Among them, the present chemically strengthened glass exhibits excellent flying stone resistance, and is thus preferably used for a protective member for a sensor mounted on a moving device, and more preferably used for a protective member for an in-vehicle sensor. FIG. 1A and FIG. 1B show perspective views showing an example of a configuration of a protective member formed entirely or partially of the present chemically strengthened glass.

FIG. 1A shows a structure in which a protective glass 10 is used for a lid of a cylindrical housing (protective member 1) that houses a sensor 20, and FIG. 1B shows a structure in which a glass is used for a spherical surface of a hemisphere that houses the sensor 20. The protective member 1 is formed partially or entirely using the protective glass 10, and the present chemically strengthened glass can be used for the protective glass 10.

As shown in FIG. 1A, the protective member 1 may have a support portion 2 formed in a part of the protective member 1 for supporting the protective glass 10. The support portion 2 may be made of a glass, or may also be made of a metal such as stainless steel or anodized aluminum.

The protective member 1 is not limited to a cylindrical or hemispherical shape, or may have a three-dimensional shape such as a cylindrical shape, a prismatic shape, or a spherical regular polyhedron. The protective member 1 can be formed by bonding together a plurality of glasses. In the case where the support portion 2 is formed, an adhesive layer can be formed between the support portion 2 and the protective glass 10 to bond the support portion 2 and the protective glass 10.

<Production Method for Chemically Strengthened Glass>

A chemically strengthened glass production method according to the present embodiment (hereinafter also referred to as the present production method) includes a step of bringing a glass for chemical strengthening having a thickness of more than 2 mm into contact with an inorganic salt composition containing 80 mass % or more of potassium nitrate to perform ion exchange (hereinafter abbreviated as a step A).

A chemical strengthening treatment for forming a compressive stress layer on a surface layer of a glass is a treatment in which a glass plate is brought into contact with an inorganic salt composition to substitute metal ions in the glass with metal ions in the inorganic salt composition, which have an ion radius greater than that of the metal ions in the glass.

Examples of a method of bringing the glass into contact with the inorganic salt composition include a method in which a paste inorganic salt composition is applied to a glass, a method in which an aqueous solution of an inorganic salt composition is sprayed onto a glass, and a method in which a glass is immersed in a salt bath of a molten salt of an inorganic salt composition heated to a temperature equal to or higher than a melting point. Among them, from the viewpoint of improving the productivity, a method in which a glass is immersed in a salt bath of a molten salt of an inorganic salt composition is preferred.

In the present description, the "inorganic salt composition" refers to a composition containing a molten salt. Examples of the molten salt contained in the inorganic salt composition include a nitrate, a sulfate, a carbonate, and a chloride. Examples of the nitrate include lithium nitrate, sodium nitrate, potassium nitrate, cesium nitrate, rubidium nitrate, and silver nitrate. Examples of the sulfate include lithium sulfate, sodium sulfate, potassium sulfate, cesium sulfate, rubidium sulfate, and silver sulfate. Examples of the chloride include lithium chloride, sodium chloride, potassium chloride, cesium chloride, rubidium chloride, and silver chloride. These may be used alone or in combination of plural types thereof.

The inorganic salt composition is preferably a composition containing a nitrate as a base, and more preferably a composition containing sodium nitrate or potassium nitrate as a base. In the present description, the expression "as a base" means that the content in the inorganic salt composition is 80 mass % or more.

<<Step A: step of bringing glass for chemical strengthening into contact with inorganic salt composition containing 80 mass % or more of potassium nitrate to perform ion exchange>>

In the step of bringing a glass for chemical strengthening into contact with an inorganic salt composition containing 80 mass % or more of potassium nitrate to perform ion exchange, sodium ions in the glass are exchanged with potassium ions in the inorganic salt composition. The content of potassium nitrate in the inorganic salt composition used in the step is 80 mass % or more, preferably 85 mass % or more, more preferably 90 mass % or more, still more preferably 95 mass % or more, particularly preferably 98 mass % or more, and most preferably 100 mass %.

The inorganic salt composition in the step A may contain other inorganic salts in addition to potassium nitrate. Examples of the other inorganic salts include potassium carbonate, potassium sulfate, potassium chloride, sodium nitrate, sodium carbonate, sodium sulfate, and sodium chloride. Among them, sodium nitrate is preferred.

In the step A, the temperature of the inorganic salt composition to be brought into contact with the glass for chemical strengthening is preferably 360° C. or higher, more preferably 370° C. or higher, still preferably 380° C. or higher, and particularly preferably 390° C. or higher. In addition, the temperature of the inorganic salt composition is preferably 500° C. or lower, more preferably 480° C. or lower, still more preferably 465° C. or lower, and particularly preferably 455° C. or lower, from the viewpoint of improving the flying stone resistance, the drop ball strength, and the scratch resistance while maintaining the appearance quality after the ion exchange.

In the step A, the time for which the glass for chemical strengthening is brought into contact with the inorganic salt composition is preferably 10 minutes or longer and 30 hours or shorter. The contact time is more preferably 30 minutes or longer, still more preferably 45 minutes or longer, and particularly preferably 1 hour or longer. When the contact time is 10 minutes or longer, the surface compressive stress can be increased. In addition, the contact time is more preferably 24 hours or shorter, still more preferably 16 hours or shorter, and particularly preferably 12 hours or shorter. When the time is 24 hours or shorter, the flying stone resistance, the drop ball strength, and the scratch resistance can be improved.

<<Step A'>>

Examples of an embodiment of the step A include an embodiment including a step A' of bringing the glass for chemical strengthening into contact with an inorganic salt composition containing 80 mass % or more of potassium nitrate and containing at least one salt selected from the group consisting of $K_2CO_3$, $Na_2CO_3$, $KHCO_3$, $NaHCO_3$, $K_3PO_4$, $Na_3PO_4$, $K_2SO_4$, $Na_2SO_4$, KOH, and NaOH (hereinafter, the salt is also referred to as a "flux") to obtain a chemically strengthened glass in the ion exchange.

(Ion Exchange)

In the step A', in the case where, for example, $K_2CO_3$ is used as the flux, when the content of the flux in the inorganic salt composition is 0.1 mass % or more, and the temperature in the chemical strengthening treatment is 350° C. to 500° C., the ion exchange treatment time is preferably 1 minute to 10 hours, more preferably 5 minutes to 8 hours, and still more preferably 10 minutes to 4 hours.

The amount of the flux added in the inorganic salt composition is preferably 0.1 mass % or more, more preferably 0.5 mass % or more, still more preferably 1 mass % or more, and particularly preferably 3 mass % or more, from the viewpoint of controlling the surface hydrogen concentration. In addition, the amount of the flux added is preferably equal to or less than the saturated solubility of each salt, from the viewpoint of the productivity. When the flux is excessively added, there is a risk of corrosion of the glass. For example, in the case where $K_2CO_3$ is used as the flux, the content thereof is preferably 30 mass % or less, more preferably 15 mass % or less, and particularly preferably 10 mass % or less.

In addition to the flux and potassium nitrate, the inorganic salt composition may contain other chemical species within a range that does not impede the effects of the present invention. Examples thereof include alkaline chlorides and alkaline borates such as sodium chloride, potassium chloride, sodium borate, and potassium borate. These may be added alone or in combination of plural types thereof.

In the present embodiment, in the case where the step A' is performed as the step A, it is preferable to include cleaning the chemically strengthened glass after the ion exchange step, subjecting the chemically strengthened glass to an acid treatment after the cleaning, and subjecting the chemically strengthened glass to an alkali treatment after the acid treatment. In the case of performing the cleaning, the acid treatment, and the alkali treatment, the step A' includes the above cleaning, acid treatment, and alkali treatment step. The cleaning, the acid treatment, and the alkali treatment in such an embodiment are described below.

(Cleaning)

In the cleaning, industrial water, ion exchange water, and the like are preferably used, and ion exchange water is more preferred. A cleaning condition varies depending on a cleaning liquid to be used, and in the case where ion exchange water is used, cleaning at 0° C. to 100° C. is preferred from the viewpoint of completely removing adhering salts.

(Acid Treatment)

The acid treatment in the step A' is performed by immersing the chemically strengthened glass in an acidic solution, whereby Na and/or K on the surface of the chemically strengthened glass can be substituted with H. When the acid treatment is performed, the glass surface further has a low density layer, in which the surface layer of the compressive stress layer is altered, specifically, the density is reduced. The low density layer is formed when Na and K are lost (leached) from the outermost surface of the compressive stress layer and H enters instead (substitutes Na and K).

The solution is not particularly limited as long as it is acidic and has a pH of less than 7, and the acid to be used may be either a weak acid or a strong acid. Specifically, acids such as nitric acid, hydrochloric acid, sulfuric acid, phosphoric acid, acetic acid, oxalic acid, carbonic acid, and citric acid are preferred, and nitric acid is more preferred. These acids may be used alone or in combination of plural types thereof.

The temperature at which the acid treatment is performed varies depending on the type and the concentration of the acid to be used and the time, and is preferably 100° C. or lower. The time for the acid treatment varies depending on the type and the concentration of the acid to be used and the temperature, and is preferably 10 seconds to 5 hours, and more preferably 1 minute to 2 hours, from the viewpoint of the productivity. The concentration of the solution for the acid treatment varies depending on the type of the acid to be used, the time, and the temperature, and is preferably a concentration at which concerns about corrosion of the container is minimized, specifically preferably, 0.1 mass % to 20 mass %.

More specifically, in the case where, for example, nitric acid is used in the acid treatment, the content of nitric acid in the solution for the acid treatment is preferably 0.1 mass % to 20 mass %, and more preferably 0.5 mass % to 10 mass %, the treatment temperature is preferably 20° C. to 80° C., and more preferably 40° C. to 70° C., and the treatment time is preferably 1 minute to 60 minutes, and more preferably 1 minute to 15 minutes.

The low density layer is removed by an alkali treatment to be described below, and the thicker the low density layer, the more easily the glass surface is removed. Therefore, from the viewpoint of the amount of removal from the glass surface, the thickness of the low density layer is preferably 5 nm or more, and more preferably 20 nm or more. The thickness of the low density layer can be controlled according to the flux concentration, the sodium concentration, the temperature, the time, and the like in the ion exchange step.

(Alkali Treatment)

The alkali treatment in the step A' is performed by immersing the chemically strengthened glass in a basic solution, whereby the low density layer formed by the acid treatment can be removed partially or entirely.

The solution to be used in the alkali treatment is not particularly limited as long as it is basic and has a pH of more than 7, and either a weak base or a strong base may be used. Specifically, bases such as sodium hydroxide, potassium hydroxide, potassium carbonate, and sodium carbonate are preferred, and sodium hydroxide is more preferred. These bases may be used alone or in combination of plural types thereof.

The temperature at which the alkali treatment is performed varies depending on the type and the concentration of the base to be used and the time, and is preferably 0° C. to 100° C., more preferably 10° C. to 80° C., and particularly preferably 20° C. to 60° C. Such a temperature range is preferred since there is no risk of corrosion of the glass.

The time for the alkali treatment varies depending on the type and the concentration of the base to be used and the temperature, and is preferably 10 seconds to 5 hours, and more preferably 1 minute to 2 hours, from the viewpoint of the productivity.

The concentration of the base contained in the solution for the alkali treatment varies depending on the type of the base to be used, the time, and the temperature, and is preferably 0.1 wt % to 20 wt % from the viewpoint of the removability from the glass surface.

More specifically, in the case where, for example, sodium hydroxide is used in the alkali treatment, the content of sodium hydroxide in the solution for the alkali treatment is preferably 0.1 mass % to 20 mass %, and more preferably 0.5 mass % to 10 mass %, the treatment temperature is preferably 20° C. to 80° C., and more preferably 40° C. to 70° C., and the treatment time is preferably 1 minute to 60 minutes, and more preferably 1 minute 15 minutes.

With the above alkali treatment, the low density layer that H has entered is partially or entirely removed, and a surface layer in which the hydrogen concentration profile satisfies the above specific relational equation (I) is exposed. Accordingly, a chemically strengthened glass having improved surface strength can be obtained. Further, when the low density layer is removed, any scratches present on the glass surface are also removed at the same time, which is also thought to contribute to improving the strength.

In the step A', it is preferable to perform the above cleaning between the above acid treatment and alkali treatment, or after the completion of the alkali treatment.

In the present production method, the ion exchange treatment may be a one-stage treatment, or a treatment with two or more stages (multi-stage strengthening) under two or more different conditions. In the case where the ion exchange treatment in the present production method is multi-stage strengthening, the method may include a step of bringing the glass for chemical strengthening into contact with an inorganic salt composition containing sodium nitrate as a main component (hereinafter also abbreviated as a step B) before the step A. The step A' may also be performed after flux-free ion exchange (step A).

<<Step B: step of bringing glass for chemical strengthening into contact with inorganic salt composition containing sodium nitrate as main component to perform ion exchange>>

The inorganic salt composition in the step B is not particularly limited as long as it contains sodium nitrate as a main component and does not impair the effects of the present invention. The content of sodium nitrate in the inorganic salt composition is 30 mass % or more, preferably 50 mass % or more, more preferably 70 mass % or more, still more preferably 90 mass % or more, particularly preferably 95 mass % or more, and most preferably 100 mass %.

The inorganic salt composition in the step B may contain other inorganic salts in addition to sodium nitrate. Examples of the other inorganic salts include potassium nitrate, potassium carbonate, potassium sulfate, potassium chloride, sodium carbonate, sodium sulfate, sodium chloride, lithium nitrate, lithium carbonate, lithium sulfate, and lithium chloride. Among them, potassium nitrate is preferred.

In the step B, the temperature of the inorganic salt composition to be brought into contact with the glass for chemical strengthening is preferably 360° C. or higher, more preferably 370° C. or higher, still preferably 380° C. or higher, and particularly preferably 390° C. or higher. In addition, the temperature of the inorganic salt composition is preferably 500° C. or lower, more preferably 460° C. or lower, still more preferably 430° C. or lower, and particularly preferably 400° C. or lower, from the viewpoint of improving the flying stone resistance, the drop ball strength, and the scratch resistance while maintaining the appearance quality after the ion exchange.

In the step B, the time for which the glass for chemical strengthening is brought into contact with the inorganic salt composition is preferably 10 minutes or longer and 24 hours or shorter. The contact time is more preferably 30 minutes or longer, still more preferably 45 minutes or longer, and particularly preferably 1 hour or longer. When the contact time is 10 minutes or longer, the surface compressive stress can be increased. In addition, the contact time is more preferably 12 hours or shorter, still more preferably 8 hours or shorter, and particularly preferably 6 hours or shorter. When the time is 24 hours or shorter, the flying stone resistance, the drop ball strength, and the scratch resistance can be improved.

In the present embodiment, in addition to the above chemical strengthening by the ion exchange treatment, physical strengthening may also be performed. The physical strengthening condition is sufficiently a general strengthening method of heating and cooling, and examples thereof include methods described in JP6769441B and WO 2014/030682.

In the present embodiment, in the case where the step A does not include the step A', that is, the ion exchange is performed without containing the flux in the inorganic salt composition, it is preferable to perform an etching treatment or a polishing treatment after the step A.

(Etching Treatment)

The etching treatment is performed by bringing the chemically strengthened glass into contact with hydrofluoric acid (HF) or with hydrofluoric acid and another acid (for example, hydrochloric acid, nitric acid, sulfuric acid, or phosphoric acid). Examples of the etching treatment method include known methods such as an immersion method, a spraying method, and a showering method, and the immersion method is preferred.

The concentration of hydrofluoric acid in the etching treatment liquid is preferably 1 mass % to 10 mass %, and more preferably 2 mass % to 5 mass %, from the viewpoint of facilitating time management of the amount of etching. The amount of etching in the etching treatment is preferably 0.5 μm or more, more preferably 2 μm or more, and still more preferably 3 μm or more, and is preferably 10 μm or less.

(Polishing Treatment)

The polishing treatment is preferably performed using a polishing slurry containing polishing abrasive grains. Examples of the polishing abrasive grains include colloidal silica, cerium oxide, and various glass abrasives (for example, particles of a styrene-based resin, an acrylic resin, or a urethane-based resin), and colloidal silica is preferred. From the viewpoint of further improving the flatness, the diameter of the polishing abrasive grains is preferably 5 nm to 300 nm, and more preferably 10 nm to 200 nm.

The polishing slurry is preferably a so-called aqueous medium, and the slurry preferably contains water. A water-soluble polymer, oligomer, or monomer may also be contained. The pH of the polishing slurry is preferably 4 to 9. In order to stabilize the dispersibility of the particles in the polishing slurry, various dispersants may be added as appropriate. The solid content concentration of the polishing slurry is preferably 0.0001 mass % to 20 mass %, and more preferably 0.001 mass % to 20 mass %. In the case of cerium oxide, the average particle diameter of the polishing abrasive grains in the polishing treatment is preferably 0.1 μm or more, more preferably 0.5 μm or more, still more preferably 1 μm or more, 2 μm or more, and 3 μm or more in order, and is preferably 10 μm or less.

<<Glass for Chemical Strengthening>>

The glass for chemical strengthening to be subjected to the ion exchange in the present production method is a lithium-containing aluminosilicate glass, an aluminosilicate glass, or a soda-lime glass. A preferred composition of the lithium-containing aluminosilicate glass, the aluminosilicate glass, or the soda-lime glass is similar to those described in the section <<Composition>> of <<Chemically Strengthened Glass>>. That is, the base composition preferably contains, as represented by mol % based on oxides, 52% to 75% of $SiO_2$, 1% to 20% of $Al_2O_3$, and 1% to 20% of $Na_2O$. The composition of the glass for chemical strengthening and the base composition of the chemically strengthened glass obtained by chemically strengthening the glass for chemical strengthening match each other.

As a production method for a glass for chemical strengthening, glass raw materials are appropriately blended to obtain a glass having a desired composition, the glass is heated and melted in a glass melting furnace, and then the molten glass is homogenized by bubbling, stirring, adding a refining agent, or the like, and formed into a glass plate having a predetermined thickness, followed by annealing. Alternatively, the molten glass may be formed into a block shape, annealed, and then formed into a plate shape by a cutting method.

Examples of the method for forming the glass into a plate shape include a float process, a press method, a fusion method, and a down-draw method. The float process is particularly preferred in the case of producing a large glass plate. Examples of a continuous forming method other than the float process include a fusion method and a down-draw method.

It is preferable that chemically strengthened glass obtained by the present production method has a surface compressive stress $CS_0$ of 400 MPa to 1,200 MPa, a depth of compressive stress layer DOL-tail of 2.7 μm to 30.0 μm, an absolute value of an average slope of a stress profile from a surface to a DOL-tail of 20 MPa/μm to 500 MPa/μm, and a tensile stress CT of 1.0 MPa to 16 MPa. When such ranges are satisfied, excellent flying stone resistance, drop ball strength, and scratch resistance are exhibited.

The glass for chemical strengthening may be a crystallized glass. In the case of a crystallized glass, a crystallized glass including 1 or more crystals selected from the group consisting of a lithium silicate crystal, a lithium aluminosilicate crystal, and a lithium phosphate crystal is preferred. The lithium silicate crystal is preferably a lithium metasilicate crystal, a lithium disilicate crystal, or the like. The lithium phosphate crystal is preferably a lithium orthophosphate crystal or the like. The lithium aluminosilicate crystal is preferably a β-spodumene crystal, a petalite crystal, or the like.

The crystallization rate of the crystallized glass is preferably 10% or more, more preferably 15% or more, still more preferably 20% or more, and particularly preferably 25% or more in order to improve the mechanical strength. The crystallization rate of the crystallized glass is preferably 70% or less, more preferably 60% or less, and particularly preferably 50% or less in order to improve the transparency. A low crystallization rate is also excellent in that the glass is easily bent by heating. The crystallization rate can be calculated based on the X-ray diffraction intensity by using a Rietveld method. The Rietveld method is described in "Crystal Analysis Handbook" edited by the Crystallographic Society of Japan Editing Committee of "Crystal Analysis Handbook" (Kyoritsu Shuppan, 1999, p492 to 499).

<Solar Power Generation Module>

The present chemically strengthened glass described above exhibits excellent flying stone resistance, hail resistance, drop ball strength, and scratch resistance, and can be suitably used as a member of a solar power generation module. A solar power generation module according to the present embodiment includes a light receiving surface plate and a solar cell substrate laminated in this order from a light receiving surface side to a back surface side, in which the light receiving surface plate is the present chemically strengthened glass. The light receiving surface plate has properties such as waterproofness, flameproofness, and durability. The light receiving surface plate has translucency to sunlight. Light that passes through the light receiving surface plate is captured by a solar cell.

In an embodiment of the solar power generation module according to the present embodiment, a gloss (20°) on the light receiving surface of the light receiving surface plate is 100% or more, preferably 130% or more, more preferably 150% or more, and still more preferably 170% or more. In the case of a process in which unevenness is partially formed in the glass, microcracks occur on the surface of the glass, and the drop ball strength decreases. Therefore, it is preferable that no unevenness is formed, and when the gloss (20°) on the light receiving surface is 100% or more, more excellent drop ball strength is exhibited.

In an embodiment of the solar power generation module according to the present embodiment, a gloss (60°) on the light receiving surface of the light receiving surface plate is 90% or more, preferably 110% or more, more preferably 130% or more, and still more preferably 140% or more. When the gloss (60°) on the light receiving surface is 110% or more, the occurrence of microcracks is prevented, and more excellent drop ball strength is exhibited.

In an embodiment of the solar power generation module according to the present embodiment, a gloss (85°) on the light receiving surface of the light receiving surface plate is 80% or more, preferably 100% or more, and more preferably 120% or more. When the gloss (85°) on the light receiving surface is 100% or more, the occurrence of microcracks is prevented, and excellent drop ball strength is exhibited.

The gloss can be measured according to JIS Z8741:1997.

An arithmetic mean height Sa on the light receiving surface of the present light receiving surface plate is 10 nm or less, preferably 5 nm or less, more preferably 2 nm or less, still more preferably 1 nm or less, and particularly preferably 0.5 nm or less. When the arithmetic mean height Sa on the light receiving surface is 1 nm or less, the occurrence of microcracks is prevented, and more excellent drop ball strength is exhibited. The arithmetic mean height Sa can be measured by using a laser microscope.

In the solar power generation module according to the present embodiment, a maximum height Sz on the light receiving surface of the light receiving surface plate is preferably 10 nm or less, more preferably 5 nm or less, still more preferably 1 nm or less, and particularly preferably 0.5 nm or less. When the Sz on the light receiving surface is 10 nm or less, the occurrence of microcracks is prevented, and more excellent drop ball strength is exhibited. The Sz can be measured by using a laser microscope.

In the solar power generation module according to the present embodiment, a root mean square height Sq on the light receiving surface of the light receiving surface plate is preferably 10 nm or less, more preferably 5 nm or less, still more preferably 1 nm or less, and particularly preferably 0.5 nm or less. When the Sq on the light receiving surface is 10 nm or less, the occurrence of microcracks is prevented, and more excellent drop ball strength is exhibited. The Sq can be measured by using a laser microscope.

In the solar power generation module according to the present embodiment, an arithmetic mean curvature Spc of a peak on the light receiving surface of the light receiving surface plate is preferably 100 nm or less, more preferably 20 nm or less, still more preferably 10 nm or less, and particularly preferably 5 nm or less. When the Spc on the light receiving surface is 10 nm or less, the occurrence of microcracks is prevented, and excellent drop ball strength is exhibited. The Spc can be measured by using a laser microscope.

In the solar power generation module according to the present embodiment, a developed area ratio Sdr on the light receiving surface of the light receiving surface plate is preferably 0.02 nm or less, more preferably 0.01 nm or less, and still more preferably 0.001 nm or less. When the Sdr on the light receiving surface is 0.01 nm or less, the occurrence of microcracks is prevented, and more excellent drop ball strength is exhibited. The Sdr can be measured by using a laser microscope.

Sa, Sz, Sq, Spc and Sdr can be measured according to ISO 25178.

In the solar power generation module according to the present embodiment, DOI (20) on the light receiving surface of the light receiving surface plate is preferably 70% or more, more preferably 80% or more, still more preferably 90% or more, and particularly preferably 99% or more. When the DOI (20) on the light receiving surface is 70% or more, the power generation efficiency can be further improved. The DOI can be measured according to JIS K7374:2007.

In the solar power generation module according to the present embodiment, a reflection haze value on the light receiving surface of the light receiving surface plate is preferably 20% or less, more preferably 10% or less, still more preferably 5% or less, and particularly preferably 1% or less. When the reflection haze value on the light receiving surface is 1% or less, the power generation efficiency can be further improved. The reflection haze value can be measured by using a spectrophotometer (for example, Rhopoint IQ series manufactured by Konica Minolta).

In an embodiment of the solar power generation module according to the present embodiment, a content of Sn in a range from the surface to a depth of 5 μm on the light receiving surface of the light receiving surface plate is 10 times or more, preferably 12 times or more, and more preferably 15 times or more a content of Sn in a range from a surface to a depth of 5 μm on a facing surface against the light receiving surface of the light receiving surface plate. The content of Sn, the upper limit of which is not particularly limited, can be measured by using SEM-EDX (EPMA). When the content of Sn in the range from the surface to a depth of 5 μm on the light receiving surface of the light receiving surface plate is 10 times or more the content of Sn in the range from the surface to a depth of 5 μm on the facing surface against the light receiving surface of the light receiving surface plate, the drop ball strength can be improved, and an excellent protection effect against weather such as hail and falling objects is exhibited.

In an embodiment of the solar power generation module according to the present embodiment, an absolute value of a difference between $CS_0$ on the light receiving surface of the light receiving surface plate and $CS_0$ on the facing surface against the light receiving surface of the light receiving surface plate is 10 MPa or more, preferably 12 MPa or more, more preferably 15 MPa or more, and still more preferably 20 MPa or more. When the absolute value of the difference is 10 MPa or more, a compressive stress suitable for a cracking mode on the light receiving surface and a cracking mode on the facing surface against the light receiving surface is obtained, and excellent drop ball strength is exhibited. The upper limit of the absolute value of the difference is not particularly limited.

An embodiment of the solar power generation module according to the present embodiment includes a solar power generation module including a light receiving surface plate, a solar cell substrate, and a back surface plate laminated in this order from a light receiving surface side to a back surface side, in which the back surface plate is made of a glass having a thickness 1 mm or smaller than that of the light receiving surface plate. Examples of the glass for the back surface plate include a physically strengthened glass, a chemically strengthened glass, and a non-strengthened glass. From the viewpoint of the weight and installation cost of the solar power generation module, the thickness of the back surface plate is smaller than that of the light receiving surface plate preferably by 1 mm or more, more preferably by 2 mm or more, and still more preferably by 3 mm or more.

An anti-reflection film may be formed on the light receiving surface of the light receiving surface plate of the solar power generation module according to the present embodiment. Light reflection on the light receiving surface plate can be reduced, and the efficiency of capturing sunlight can be improved. An antiglare film may also be formed on the light receiving surface of the light receiving surface plate in addition to the anti-reflection film.

EXAMPLES

Hereinafter, the present invention is described with reference to Examples, but the present invention is not limited thereto.

<Preparation of Glass for Chemical Strengthening>

Glass raw materials were blended so as to have the following compositions shown as represented by mol % based on oxides, and weighed to give 400 g of glass. Next, the mixed raw materials were charged into a platinum crucible, charged into an electric furnace at 1,500° C. to 1,700° C. melted for about 3 hours, defoamed, and homogenized.

Glass material A: 66.2% of $SiO_2$, 11.2% of $Al_2O_3$, 3.1% of MgO, 0.2% of CaO, 1.3% of $ZrO_2$, 0.5% of $Y_2O_3$, 10.4% of $Li_2O$, 5.6% of $Na_2O$, and 1.5% of $K_2O$ Glass material B: 70.64% of $SiO_2$, 1.08% of $Al_2O_3$, 6.88% of MgO, 8.26% of CaO, 0.10% of $ZrO_2$, 12.8% of $Na_2O$, and 0.2% of $K_2O$ For Examples shown in Tables 1 and 2, the obtained molten glass was poured into a metal mold, held at a temperature about 50° C. higher than the glass transition temperature for 1 hour, and then cooled to room temperature at a rate of 100° C./min, to give a glass block. From the obtained glass block, glass plates having 50 mm×50 mm×thickness (mm) shown in Tables 1 and 2 were prepared.

From a glass plate formed by a float process in Examples shown in Table 3, or from a glass plate formed by a roll-out method in Examples shown in Table 4, glass plates having 50 mm×50 mm×thickness (mm) shown in each table were prepared.

<Chemical Strengthening Treatment and Evaluation on Chemically Strengthened Glass>

The glass plate obtained above was immersed in a molten salt composition under conditions shown in Tables 1 to 4, and subjected to an ion exchange treatment, to prepare chemically strengthened glasses in the following Examples 1 to 32.

Note that, in Examples 17, 19, 24, 26 and 30, a physical strengthening treatment was performed, and then a chemical strengthening was performed by the ion exchange treatment shown in Table 3 or 4. The physical strengthening treatment was performed by raising the temperature to about 700° C., close to the softening temperature of the glass, and after the temperature had stabilized, the glass was subjected to air cooling for strengthening.

In Example 31, the glass obtained by the ion exchange treatment shown in Table 3 was immersed in 6 mass % $HNO_3$ (nitric acid) at 60° C. for 10 minutes to perform an acid treatment, and then the resultant was cleaned several times with pure water and dried by air blowing. The glass thus obtained was immersed in 4 mass % NaOH (sodium hydroxide) at 60° C. for 10 minutes to perform an alkali treatment, and then the resultant was cleaned several times with pure water and dried by air blowing.

In Example 32, the ion exchange treatment shown in Table 3 was performed, and then the glass was immersed in a mixed aqueous solution containing 2 mass % hydrofluoric acid (HF) and 15 mass % hydrochloric acid (HCL) to perform an etching treatment of 1 μm.

Examples 1 to 4, 10, 14, 18, 19, 21, 22, 25, 26, and 29 to 32 are Inventive Examples, and Examples 5 to 9, 11 to 13, 15, 16, 17, 20, 23, 24, 27 and 28 are Comparative Examples. In Tables 1 to 4, "-" indicates that the evaluation was not performed, and those that could not be measured are recorded as 0.

The obtained chemically strengthened glasses were evaluated by the following methods. The results are shown in Tables 1 to 4.

[Stress Measurement Using Scattered Light Photoelastic Stress Meter]

The stress of the chemically strengthened glass was measured by the method described in WO 2018/056121 by using a scattered light photoelastic stress meter (SLP-2000 manufactured by Orihara Industrial Co., Ltd.). A stress profile was calculated by using attached software [SlpV (Ver. 2019.11.07.001)] of the scattered light photoelastic stress meter (SLP-2000 manufactured by Orihara Industrial Co., Ltd.).

A function used for obtaining the stress profile is $\sigma(x) = [a_1 \times \mathrm{erf}_c(a_2 \times x) + a_3 \times \mathrm{erf}_c(a_4 \times x) + a_5]$, $a_i$ ($i=1$ to 5) is a fitting parameter, and erfc is a complementary error function. The complementary error function is defined by the following equation.

$$\mathrm{erfc}(x) = 1 - \mathrm{erf}(x) \quad [\text{Math. 1}]$$
$$= \frac{2}{\sqrt{\pi}} \int_x^{\infty} e^{-t^2} dt = e^{-x^2} \mathrm{erfcx}(x)$$

In the evaluation in the present description, the fitting parameter was optimized by minimizing a residual sum of squares of the obtained raw data and the above function. As the measurement treatment conditions, a single shot was performed, and regarding measurement region treatment adjustment items, an edge method was designated and selected for the surface, 6.0 μm was designated and selected for the inner surface edge, automatic was designated and selected for the inner left and right edges, automatic was designated and selected for the inner deep edge (center of the thickness of the sample), and a fitting curve was designated and selected to extend the phase curve to the center of the thickness of the sample.

At the same time, the concentration distribution of alkali metal ions (sodium ions and potassium ions) in the cross-sectional direction was measured by using SEM-EDX (EPMA), and it was found that there was no inconsistency with the obtained stress profile.

In addition, based on the obtained stress profile, the values of the compressive stress CS and the depth of compressive stress layer DOL were calculated by the above methods.

In each table, each notation represents the following.

$CS_0$: compressive stress (MPa) on glass surface measured by using FSM

DOL: depth of compressive stress layer (μm) (linear approximation) measured by using FSM DOL-tail: depth of compressive stress layer (μm) (curve approximation) measured by using FSM CTc: tensile stress (MPa) measured by using FSM CS2: compressive stress (MPa) on glass surface measured by using SLP-2000

DOC: depth of compressive stress layer (μm) measured by using SLP-2000

CT: maximum value of tensile stress (MPa) measured by using SLP-2000

Surface layer slope absolute value: absolute value of average slope (MPa/μm) of stress profile from surface to DOL-tail Deep layer slope average value 50 to DOC: absolute value of average slope (MPa/μm) of stress profile from depth of 50 μm from surface to DOC Deep layer slope average value 400 to t/2: absolute value of average slope (MPa/μm) of stress profile from depth of 400 μm from surface to thickness center portion ICT: integrated value of tensile stress CT (MPa·μm)

Light receiving surface side: light receiving surface in case where glass is used as light receiving surface plate of solar power generation module Solar cell side: surface facing light receiving surface in case where glass is used as light receiving surface plate of solar power generation module Maximum crack depth: average value (μm) among samples regarding values obtained by measuring position from surface of deepest crack in samples that did not break after flying stone test Minimum arrest line depth: position (μm) where crack first stopped propagating when crack repeatedly propagated and stopped propagating due to collision of stones during flying stone test Maximum arrest line depth: position (μm) where crack finally stopped propagating when crack repeatedly propagated and stopped propagating due to collision of stones during flying stone test Breaking start point: far from collision point in case where point at which flying stone collides with glass is different from breaking start point.

Figure 3A:
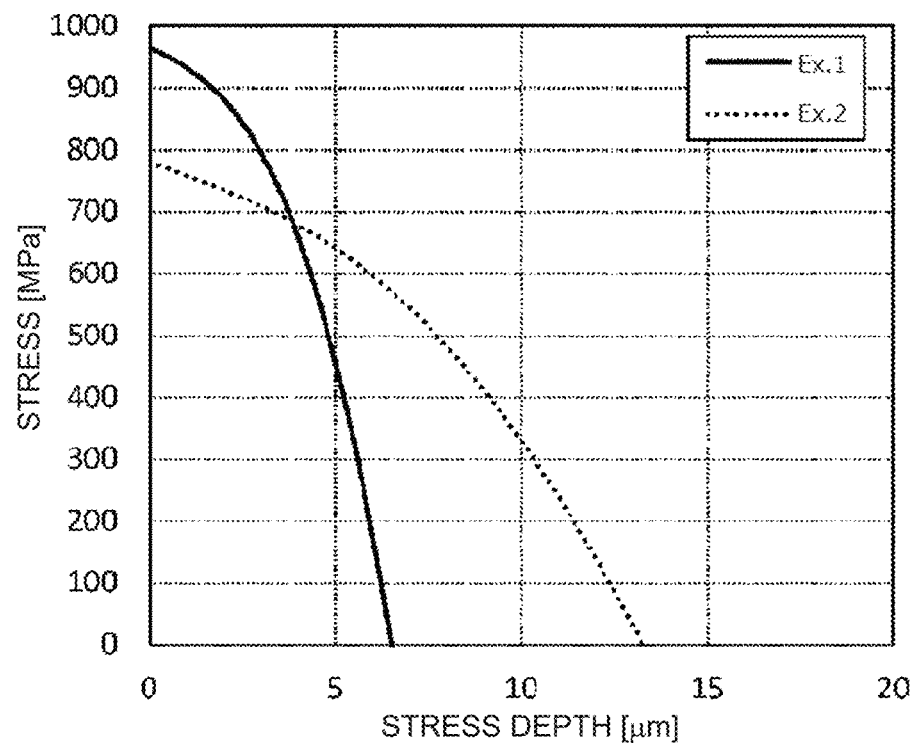
FIG. 3A to FIG. 3F are each a diagram showing an example of the stress profile of the chemically strengthened glass according to the present embodiment.
Figure 3B:
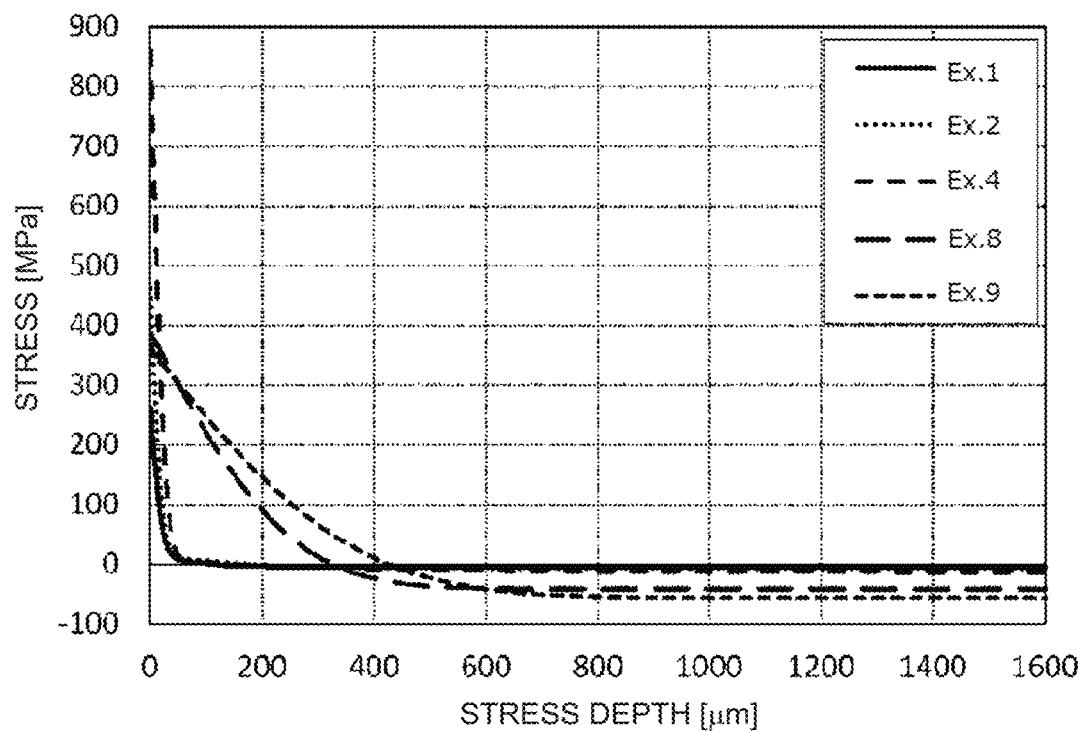
Figure 3C:
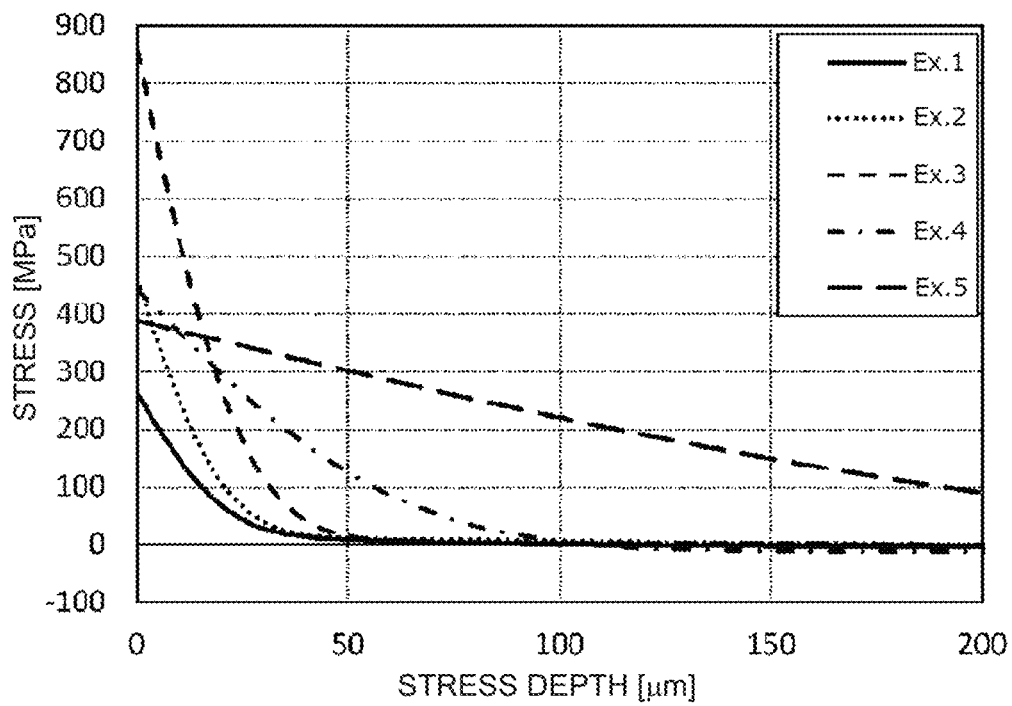
Figure 3D:
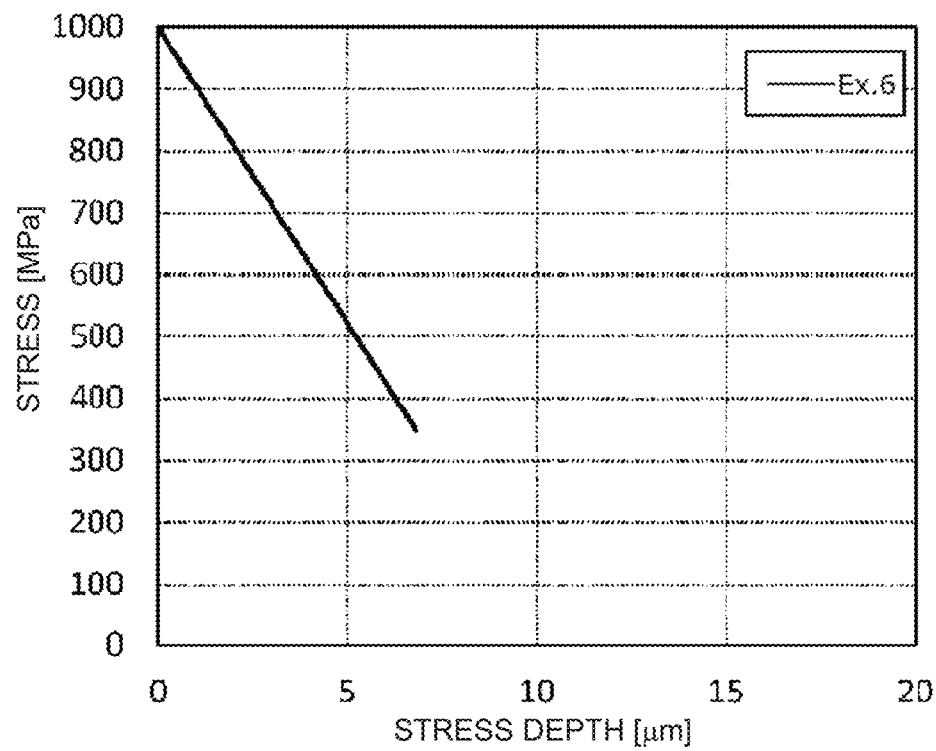
Figure 3E:
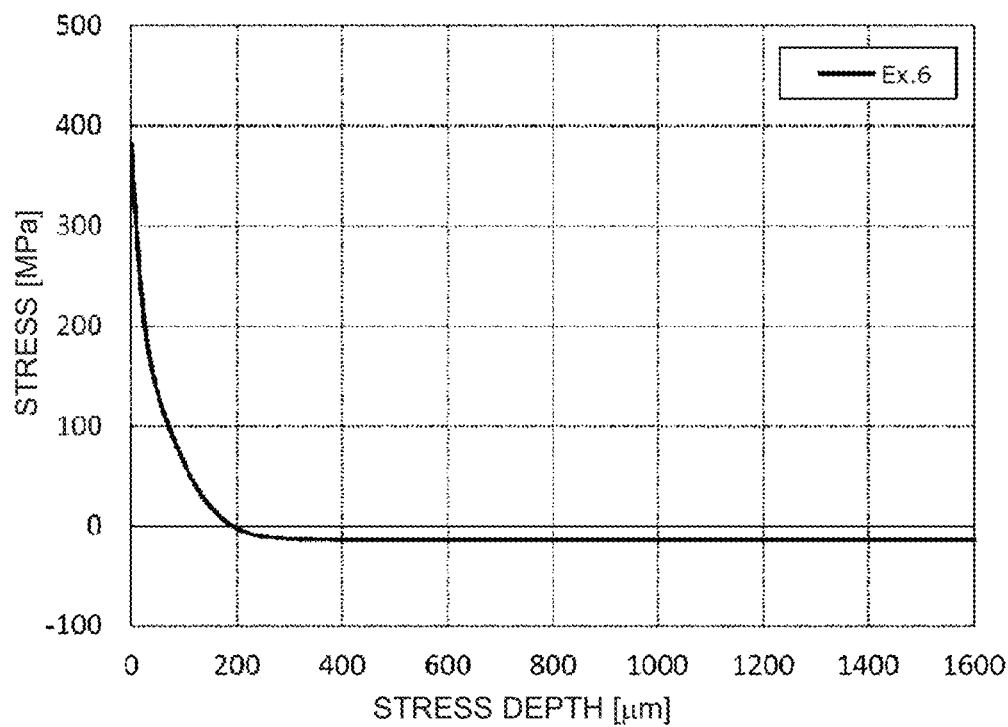
Figure 3F:
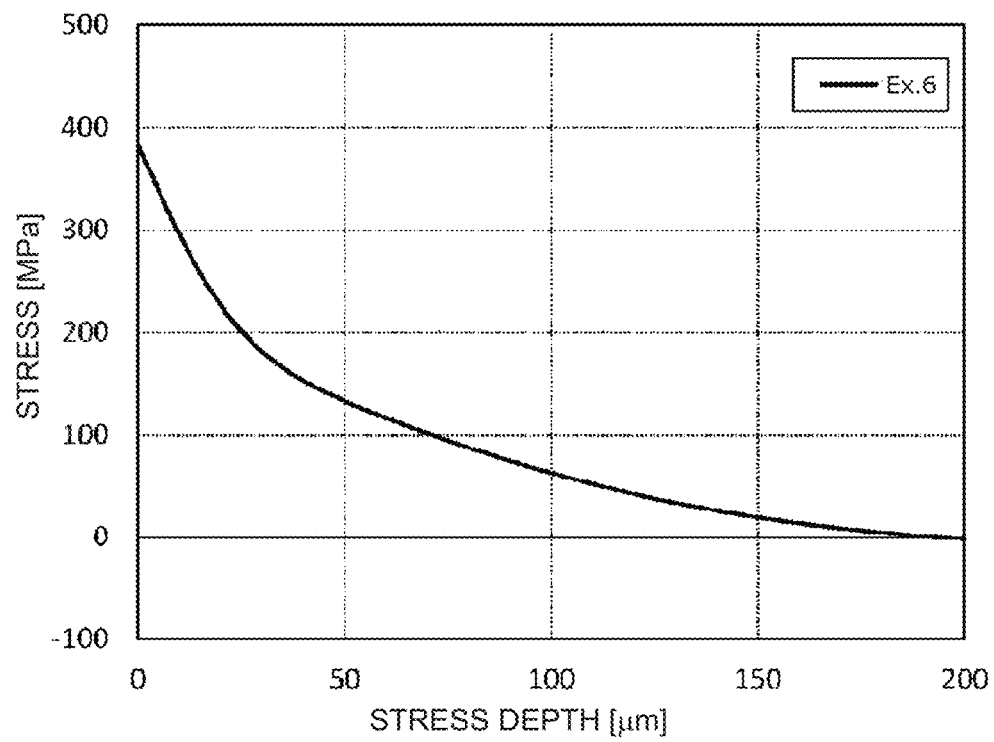

FIG. 3A to FIG. 3F show stress profiles of the chemically strengthened glasses (Examples 1 to 9). FIG. 3A and FIG. 3D show measurement results by using an FSM, and FIG. 3B, FIG. 3C, FIG. 3E, and FIG. 3F show measurement results by using an SLP.

[Flying Stone Test]

According to the strength test method in ISO 20567-1 Test Method B, a flying stone test was performed under the following conditions, and the crack occurrence rate was calculated (n≥3). The crack occurrence rate was evaluated in Tables 1 and 2 according to the following indices. In addition, the glass that had been subjected to the flying stone test was observed under a microscope (VK-X3000 and VHX-5000 manufactured by Keyence Corporation), and a maximum scratch depth and a scratch area rate were calculated.

(Conditions)
Flying stone: chilled iron grit
Stone size: 3.55 mm to 5 mm
Injection amount: 500 g
Injection pressure: 200 kPa
Sample installation angle: 54°
Injection time: 8 s to 12 s
Number of injection: 2
Sample collision area: 40 mm×40 mm The crack occurrence rate, the maximum scratch depth, and the scratch area were calculated as follows.

(Crack Occurrence Rate)

Crack occurrence rate: number of samples broken in flying stone test/total number of evaluation samples Sample crack determination: a crack extending beyond the range of individual scratches on the sample surface is present after the flying stone test.

(Maximum Scratch Depth)

Selection of scratches to be evaluated: From numerous scratches remaining on the sample surface after the flying stone test, three or more large scratches were visually selected.

Measurement of scratch depth: Using a laser microscope equipped with a white light interferometer VK-X3000 (manufactured by Keyence Corporation), the fine shape of the selected scratch was scanned with a laser, and the depth of the deepest point was recorded.

Maximum scratch depth: The greatest value among the measured scratch depths was taken as the maximum scratch depth.

(Scratch Area)

Measurement range: a range of 35 mm×35 mm in a center of a sample

Image capture: Using a microscope VHX-5000 (manufactured by Keyence Corporation), images of the sample after the flying stone test were captured under a coaxial epi-illumination light source.

Extraction and area of scratch: Using VHX-5000 (manufactured by Keyence Corporation), the captured image was binarized using luminance to extract scratches on the sample surface, and a total area of the scratches was divided by an area of the measurement range to obtain the scratch area.

(Evaluation Indices)

A: the crack occurrence rate is 0% and the scratch area is 6% or less

B: the crack occurrence rate is 0% and the scratch area is more than 6%

C: the crack occurrence rate is more than 0% and 20% or less and the scratch area is 6% or less D: the crack occurrence rate is more than 0% and 20% or less and the scratch area is more than 6%

E: the crack occurrence rate is more than 20% and 100% or less

[Breaking Strength]

The breaking strength was measured by the following method. For the samples in Examples 2, 4 and 7 to 9 subjected to the flying stone test, the maximum crack depth, the minimum arrest line depth, and the maximum arrest line depth were measured. The results are shown in Tables 1 and 2.

FIG. 4 shows appearances of the samples in Examples 1, 2, 7, and 15 subjected to the flying stone test, captured with a digital camera (EOS Kiss X6i manufactured by Canon Inc.).

[Drop Ball Strength]

The drop ball strength was measured by the following method.

For Tables 1 and 2, a test was performed by dropping a 500 g iron ball onto a glass substrate having a thickness of 3.2 mm and made of the above chemically strengthened glass, and gradually increasing the drop height until the glass substrate broke. The drop height at which the glass substrate broke was measured, and an average value of crack heights of five test pieces was taken as the drop ball strength. Regarding evaluation on the drop ball strength, A: the average crack height is 60 cm or more; B: the average crack height is 40 cm or more and less than 60 cm; C: the average crack height is 20 cm or more and less than 40 cm; D: the average crack height is less than 20 cm.

For Tables 3 and 4, a test was performed by dropping a 500 g iron ball and a 900 g iron ball onto a glass substrate having a thickness of 3.2 mm and made of the above chemically strengthened glass, and gradually increasing the drop height until the glass substrate broke. The drop height at which the glass substrate broke was measured, and an average value of crack heights of five test pieces was taken as the drop ball strength. In addition, an average value of energy when a 500 g iron ball and a 900 g iron ball were dropped onto the glass substrate and five test pieces were cracked was calculated using the formula of mass of each falling ball×g×height, and this was taken as the collision energy.

For Tables 3 and 4, ice balls (diameter: 55 mm, 65 mm, or 75 mm) were each collided with a glass substrate having a thickness of 3.2 mm and made of the above chemically strengthened glass by the following test method. The test was performed on five test pieces, and the crack occurrence rate was determined.

Method: an ice ball is collided with a 100 mm×100 mm glass.

The drop speed and the energy of the ice ball having each diameter are as follows.

Ice ball having diameter of 55 mm: drop speed: 33.9 m/s, energy: 46 J

Ice ball having diameter of 65 mm: drop speed: 36.7 m/s, energy: 89 J

Ice ball having diameter of 75 mm: drop speed: 39.5 m/s, energy: 158 J

[Appearance Properties]

The gloss, the DOI (distinctness of image), and the reflection haze value were measured using an appearance analyzer (Rhopoint IQ, manufactured by Konica Minolta) by the following methods.

(Gloss)

The gloss was measured at incident angles of 20°, 60°, and 85° according to JIS Z8741:1997.

(DOI)

The distinctness of image (DOI (20)) was measured according to JIS K7374:2007.

(Reflection Haze Value)

The reflection haze value was measured using a Rhopoint IQ series manufactured by Konica Minolta.

[Evaluation Using Variable Angle Photometer]

The measurement was performed using a variable angle photometer (GC5000L, manufactured by NIPPON DENSHOKU INDUSTRIES Co., Ltd.) by the following methods.

(0 Deg Transmission)

The value of 0 deg transmission was a value determined by measuring the luminance transmitted perpendicularly to a substrate and comparing with a standard transparent substrate. The value of "total" was calculated by measuring a luminance distribution while changing a light receiving portion in a range of −90° to +90°.

The resolution index values T in Tables 3 and 4 were measured according to the method described in JP5867649B.

(45 Deg Reflection)

The value of 45 deg reflection was a relative luminance ratio determined by measuring the specular reflection luminance of light incident at an angle of 45° to a substrate and comparing with a standard substrate. The value of "total" was calculated by measuring a luminance distribution while changing a light receiving portion in a range of 0° to +90°.

The reflection image diffusion index values R in Tables 3 and 4 were measured according to the method described in JP5867649B.

[Bidirectional Reflectance Distribution Function (BRDF)]

The value of BRDF was measured, using an image sensor type 3D BRDF/BTDF measuring device series Mini-Diff V2 (manufactured by Synopsys Inc.) with a light source color of green (center wavelength: 525 nm), on a glass alone (evaluation area: 20 mm×20 mm) provided on black felt (reflectance: about 0%), including back reflection. A solid angle width at half luminance was measured at incident angles of 0°, 20°, 40° and 60°

[Surface Roughness]

The values of Sa and Sz were measured under the following conditions by using a laser microscope (VK-X3000, laser microscope mode, manufactured by Keyence Corporation) at ×10, 3 mm×3 mm.

Resolution output data for Z step=0.1 nm (actual measurement at Z step=3 μm, supplemented by RPD2 mode)
4 mm×3 mm in field of view (objective lens ×10, combined mode 3×3 field of view measured)
Spatial resolution of XY step≈2.8 μm, about 1,405×1,054 pixel image

[Martens Hardness]

PICODENTOR (registered trademark) HM500 was used as a measuring device, measurement was performed at a total of three locations at the center of the glass plate and in the vicinity under the following conditions, and the average of the measured values at the three locations was taken as the Martens hardness.

Pressing load: 500 mN
Hold time: 5 seconds
Loading speed and unloading speed: 100 mN/s

[Hydrogen Concentration]

According to the method described above in [Method for Measuring Hydrogen Concentration Profile], the hydrogen concentration profile was measured, and the relational equation [I] was derived. The hydrogen concentration profiles in Example 21 and Example 31 were measured. As a result, in Example 21, a is −0.166 and b is 0.134, and in Example 31, a is 0.003 and b is 0.016.

[Polishing Scratch]

The presence or absence of the polishing scratch was determined by surface observation by using an atomic force microscope (AFM). The surface scratch in Example 31 was observed. As a result, two or more scratches having a length of 5 μm or more and a width of 0.1 μm or more are not present within a region of 10 μm×5 μm, and the surface is free of the polishing scratch.

[Surface Roughness (Ra)]

The surface roughness Ra was measured by using an AFM under the following measurement conditions.

AFM measurement conditions: atomic force microscope (XE-HDM manufactured by Park Systems), scan size: 1 μm×1 μm, color scale: ±1 nm, scan speed: 1 Hz.

The Ra in Example 31 was measured and was found to be 0.40 nm or more.

TABLE 1

|  |  |  | Ex. 1 | Ex. 2 | Ex. 3 | Ex. 4 | Ex. 5 | Ex. 6 | Ex. 7 |
|---|---|---|---|---|---|---|---|---|---|
|  | Glass material |  | A | A | A | A | A | A | A |
|  | Thickness [mm] |  | 3.5 | 3.5 | 3.5 | 3.5 | 3.5 | 3.5 | 3.5 |
| Strengthening condition | Primary strengthening | Salt concentration (mass %) | 100% $KNO_3$ | 100% $KNO_3$ | 100% $KNO_3$ | 100% $KNO_3$ | 100% $KNO_3$ | 100% $NaNO_3$ | No |
|  |  | Temperature and time | 450° C. 1 hr | 450° C. 5 hr | 390° C. 1 hr | 450° C. 24 hr | 450° C. 72 hr | 450° C. 0.5 hr |  |
|  | Secondary strengthening | Salt concentration (mass %) | No | No | No | No | No | 100% $KNO_3$ | No |
|  |  | Temperature and time |  |  |  |  |  | 450° C. 1 hr |  |
| FSM measurement result | $CS_0$ | MPa | 967 | 779 | 1105 | 685 | 447 | 999 | 0 |
|  | DOL | μm | 8.2 | 15.7 | 4.1 | 31.8 | 52.1 | 7.7 | 0 |
|  | DOL-tail | μm | 6.5 | 13.3 | 3.3 | 26.9 | 44.1 | 6.8 | 0 |
|  | CTc | MPa | 1.8 | 3.0 | 1.1 | 5.4 | 5.8 | 1.9 | 0 |
|  | Surface layer slope absolute value | MPa/μm | 149 | 59 | 335 | 25 | 10 | 147 | 0 |
| SLP-2000 measurement result | CS2 | MPa | 264 | 462 | 106 | 861 | 1111 | 383 | 4 |
|  | DOC | um | 112 | 189 | 55.8 | 172 | 82.4 | 194 | 0 |
|  | CT | MPa | 4.4 | 6.6 | 1.8 | 12.7 | 25.6 | 13.8 | −0.7 |
|  | ICT | MPa · μm | 7000 | 9713 | 2818 | 16981 | 28954 | 20992 | 0 |
|  | Deep layer slope average value 50 to DOC | MPa/μm | 0.14 | 0.08 | 0.22 | 0.12 | 2.49 | 0.93 | 0.000 |
|  | Deep layer slope average value 400 to t/2 | MPa/μm | 0.000 | 0.000 | 0.000 | 0.004 | 0.011 | 0.000 | 0.000 |
| Drop ball strength | Average crack height | cm | 64 or more | 64 or more | — | — | — | — | 29 |
|  | Evaluation |  | A | A | — | — | — | — | C |
| Flying stone test | Crack occurrence rate | % | 0 | 0 | 0 | 20 | 40 | 40 | 20 |
|  | Maximum crack depth | μm | 1022 | 983 | — | — | — | — | 829 |

TABLE 1-continued

|  |  | Ex. 1 | Ex. 2 | Ex. 3 | Ex. 4 | Ex. 5 | Ex. 6 | Ex. 7 |
|---|---|---|---|---|---|---|---|---|
| Minimum arrest line depth | μm | — | 250 | — | 358 | — | — | 217 |
| Maximum arrest line depth | μm | — | 1179 | — | 1495 | — | — | 864 |
| Breaking start point |  | Far from collision point | Far from collision point | — | Far from collision point | — | — | Far from collision point |
| Maximum scratch depth | μm | 163 | 143 | 126 | 144 | 138 | 152 | 162 |
| Scratch area | % | 4.4 | 4.9 | 6.0 | 4.1 | 4.8 | 2.5 | 7.1 |
| Evaluation |  | A | A | A | C | E | E | D |

TABLE 2

|  |  |  | Ex. 8 | Ex. 9 | Ex. 10 | Ex. 11 | Ex. 12 | Ex. 13 | Ex. 14 | Ex. 15 |
|---|---|---|---|---|---|---|---|---|---|---|
|  | Glass material |  | A | A | A | A | A | A | B | B |
|  | Thickness [mm] |  | 3.5 | 3.5 | 5 | 5 | 2 | 2 | 3.5 | 3.5 |
| Strengthening condition | Primary strengthening | Salt concentration (mass %) | 100% NaNO$_3$ | 100% NaNO$_3$ | 100% KNO$_3$ | 100% NaNO$_3$ | 100% KNO$_3$ | 100% NaNO$_3$ | 100% KNO$_3$ | No |
|  |  | Temperature and time | 450° C. 8 hr | 450° C. 18 hr | 450° C. 1 hr | 450° C. 2 hr | 450° C. 1 hr | 450° C. 2 hr | 450° C. 1 hr |  |
|  | Secondary strengthening | Salt concentration (mass %) | No | No | No | No | No | No | No | No |
|  |  | Temperature and time |  |  |  |  |  |  |  |  |
| FSM measurement result | CS$_0$ | MPa | 0 | 0 | 915 | 0 | 994 | 0 | 687 | 0 |
|  | DOL | μm | 0 | 0 | 8.9 | 0 | 7.7 | 0 | 6.4 | 0 |
|  | DOL-tail | μm | 0 | 0 | 7.1 | 0 | 6.4 | 0 | 5.8 | 0 |
|  | CTc | MPa | 0 | 0 | 1.3 | 0 | 3.2 | 0 | 1.1 | 0 |
|  | Surface layer slope absolute value | MPa/μm | 0 | 0 | 129 | 0 | 155 | 0 | 118 | 0 |
| SLP-2000 measurement result | CS2 | MPa | 388 | 362 | 255 | 398 | 235 | 421 | — | — |
|  | DOC | μm | 326 | 427 | 174 | 235 | 88 | 172 | — | — |
|  | CT | MPa | 41.1 | 56.1 | 2.1 | 15.0 | 6.0 | 38.7 | — | — |
|  | ICT | MPa·μm | 55274 | 67201 | 4867 | 33454 | 5256 | 30469 | — | — |
|  | Deep layer slope average value 50 to DOC | MPa/μm | 1.09 | 0.81 | 0.11 | 1.38 | 0.18 | 2.00 | — | — |
|  | Deep layer slope average value 400 to t/2 | MPa/μm | 0.013 | 0.050 | 0.000 | 0.000 | 0.000 | 0.000 | — | — |
| Drop ball strength | Average crack height | cm | — | — | — | — | — | — | 64 or more | 31 |
|  | Evaluation |  | — | — | — | — | — | — | A | C |
| Flying stone test | Crack occurrence rate | % | 100 | 100 | 0 | 40 | 100 | 100 | 0 | 40 |
|  | Maximum crack depth |  | — | — | — | — | — | — | — | — |
|  | Minimum arrest line depth | μm | 197 | 314 | — | — | — | — | — | — |
|  | Maximum arrest line depth | μm | 306 | 397 | — | — | — | — | — | — |
|  | Breaking start point |  | — | — | — | — | — | — | — | — |
|  | Maximum scratch depth | μm | — | — | 159 | 128 | — | — | 172 | 170 |
|  | Scratch area | % | — | — | 4.7 | 2 | — | — | 17 | 13 |
|  | Evaluation |  | E | E | A | E | E | E | B | E |

TABLE 3

|  |  |  |  | Ex. 16 | Ex. 17 | Ex. 18 | Ex. 19 | Ex. 20 |
|---|---|---|---|---|---|---|---|---|
|  | Production method |  |  | Float | | | | |
|  | Glass material |  |  | Glass material B | | | | |
|  | Thickness [mm] |  |  | 2.1 | | | | 3.2 |
| Strengthening condition | Physical strengthening |  |  | No | Yes | No | Yes | No |
|  | Primary strengthening | Salt concentration | (mass %) | No | No | 100% KNO$_3$ | 100% KNO$_3$ | No |
|  |  | Temperature and time |  |  |  | 420° C. 90 min | 420° C. 90 min |  |
|  | Secondary strengthening | Salt concentration | (mass %) | No | No | No | No | No |
|  |  | Temperature and time |  | — | — | — | — | — |
| FSM measurement result | Solar cell side | CS$_0$ | MPa | 0 | — | 622 | 578 | 0 |
|  |  | DOL | μm | 0 | — | 6.0 | 6.1 | 0 |
|  |  | DOL-tail | μm | 0 | — | 5.1 | 5.3 | 0 |
|  |  | Surface layer slope | MPa/μm | 0 | — | 122 | 109 | 0 |
|  | Light receiving surface side | CS$_0$ | MPa | 0 | — | — | — | 0 |
|  |  | DOL | μm | 0 | — | — | — | 0 |
| SLP-2000 measurement result |  | CS2 | MPa | 0 | 50 | 94 | 129 | 0 |
|  |  | DOC | μm | 0 | 366 | 47 | 308 | 0 |
|  |  | CT | MPa | 0 | 22 | 3.7 | 15 | 0 |
|  |  | ICT | MPa · μm | 0 | 7437 | 2789 | 5826 | 0 |
|  | Deep layer slope average value | 50 to DOC | MPa/μm | 0 | 0.12 | 0.24 | 0.07 | 0.00 |
|  |  | 400 to t/2 | MPa/μm | 0 | 0.038 | 0.001 | 0.022 | 0.000 |
| Appearance property | Gloss | 20° | % | 189 | — | — | — | 178 |
|  |  | 60° | % | 155 | — | — | — | 145 |
|  |  | 85° | % | 125 | — | — | — | 123 |
|  | DOI (20) |  | % | 99 | — | — | — | 99 |
|  | Reflection haze value |  | % | 0 | — | — | — | 0 |
| Goniophotometer | 0 deg transmission |  | % | 99.3 | — | — | — | 98.6 |
|  | Total of 0 deg transmission |  | % | 100.8 | — | — | — | 100.2 |
|  | Resolution index value T |  | — | 0.02 | — | — | — | 0.02 |
|  | 45 deg reflection |  | % | 50.2 | — | — | — | 32.8 |
|  | Total of 45 deg reflection |  | % | 59.5 | — | — | — | 56.9 |
|  | Reflection image diffusion index value R |  | — | 0.16 | — | — | — | 0.42 |
| BRDF | Incident angle 0° |  | deg | 2 | — | — | — | 2 |
|  | Incident angle 20° |  | deg | 3 | — | — | — | 3 |
|  | Incident angle 40° |  | deg | 3 | — | — | — | 2 |
|  | Incident angle 60° |  | deg | 5 | — | — | — | 5 |
| Surface roughness | Sa |  | nm | 0.2 | — | — | — | 0.2 |
|  | Sz |  | nm | 8.1 | — | — | — | 1.5 |
|  | Martens hardness |  | N/mm$^2$ | 3,532 | 3,460 | 3,744 | 3,676 | 3,583 |
| Drop ball test | 500 g iron ball | Average crack height | cm | 60 | 53 | 87 | 86 | 154 |
|  |  | Energy | J | 2.9 | 2.6 | 4.3 | 4.2 | 7.6 |
|  | 900 g iron ball | Average crack height | cm | 34 | 41 | — | — | 97 |
|  |  | Energy | J | 3.0 | 3.6 | — | — | 8.6 |
|  | Ice ball having 55 mmφ | Crack occurrence rate | % | 100 | — | 0 | — | 0 |
|  | Ice ball having 65 mmφ | Crack occurrence rate | % | 100 | — | 100 | — | 0 |
|  | Ice ball having 75 mmφ | Crack occurrence rate | % | 100 | — | 100 | — | 100 |
| Flying stone test | Crack occurrence rate |  | % | — | 100 | 100 | — | — |
|  | Scratch area |  | % | — | — | 10 | — | — |
|  | Flying stone evaluation |  | — | — | — | E | E | — |

TABLE 3-continued

|  |  |  |  | Ex. 21 | Ex. 22 | Ex. 31 | Ex. 32 |
|---|---|---|---|---|---|---|---|
|  | Production method |  |  | Float | | | |
|  | Glass material |  |  | Glass material B | | | |
|  | Thickness [mm] |  |  | 3.2 | | | |
| Strengthening condition | Physical strengthening |  |  | No | No | No | No |
|  | Primary strengthening | Salt concentration | (mass %) | 100% $KNO_3$ | 100% $KNO_3$ | 8% $K_2CO_3$ 1% $NaNO_3$ 91% $KNO_3$ | 100% $KNO_3$ |
|  |  | Temperature and time |  | 420° C. 90 min | 410° C. 170 min | 420° C. 90 min | 420° C. 90 min |
|  | Secondary strengthening | Salt concentration | (mass %) | No | No | No | No |
|  |  | Temperature and time |  | — | — | — | — |
| FSM measurement result | Solar cell side | $CS_0$ | MPa | 608 | 602 | 671 | 505 |
|  |  | DOL | μm | 5.9 | 6.0 | 5.9 | 5.0 |
|  |  | DOL-tail | μm | 5.2 | 5.2 | 5.2 | 4.2 |
|  |  | Surface layer slope | MPa/μm | 117 | 116 | 129 | 120 |
|  | Light receiving surface side | $CS_0$ | MPa | — | 694 | — | — |
|  |  | DOL | μm | — | 10 | — | — |
| SLP-2000 measurement result |  | CS2 | MPa | 109 | 58 | 109 | 85 |
|  |  | DOC | μm | 49 | 71 | 49 | 45 |
|  |  | CT | MPa | 2.6 | 1.8 | 2.6 | 2.0 |
|  |  | ICT | MPa · μm | 3818 | 2111 | 3818 | 3312 |
|  | Deep layer slope average value | 50 to DOC | MPa/μm | 0.27 | 0.26 | 0.27 | 0.26 |
|  |  | 400 to t/2 | MPa/μm | 0.000 | 0.001 | 0.000 | 0.000 |
| Appearance property | Gloss | 20° | % | — | 180 | — | — |
|  |  | 60° | % | — | 142 | — | — |
|  |  | 85° | % | — | 127 | — | — |
|  | DOI (20) |  | % | — | 99 | — | — |
|  | Reflection haze value |  | % | — | 0 | — | — |
| Goniophotometer | 0 deg transmission |  | % | — | 99.1 | — | — |
|  | Total of 0 deg transmission |  | % | — | 100.3 | — | — |
|  | Resolution index value T |  | — | — | 0.02 | — | — |
|  | 45 deg reflection |  | % | — | 32.3 | — | — |
|  | Total of 45 deg reflection |  | % | — | 56.5 | — | — |
|  | Reflection image diffusion index value R |  | — | — | 0.41 | — | — |
| BRDF | Incident angle 0° |  | deg | — | 2 | — | — |
|  | Incident angle 20° |  | deg | — | 3 | — | — |
|  | Incident angle 40° |  | deg | — | 2 | — | — |
|  | Incident angle 60° |  | deg | — | 5 | — | — |
| Surface roughness | Sa |  | nm | — | 0.2 | 0.4 | — |
|  | Sz |  | nm | — | 1.3 | 2.5 | — |
|  | Martens hardness |  | N/mm² | 3,761 | — | — | — |
| Drop ball test | 500 g iron ball | Average crack height | cm | 230 | — | 280 | 330 |
|  |  | Energy | J | 11.3 | — | 13.9 | 16.4 |
|  | 900 g iron ball | Average crack height | cm | — | 96 | — | — |
|  |  | Energy | J | — | 8.5 | — | — |
|  | Ice ball having 55 mmφ | Crack occurrence rate | % | 0 | 0 | 0 | 0 |
|  | Ice ball having 65 mmφ | Crack occurrence rate | % | 0 | 0 | 0 | 0 |
|  | Ice ball having 75 mmφ | Crack occurrence rate | % | 0 | 40 | 0 | 0 |
| Flying stone test | Crack occurrence rate |  | % | 0 | 0 | 0 | 0 |
|  | Scratch area |  | % | 18 | 18 | 15 | 16 |
|  | Flying stone evaluation |  | — | B | B | B | B |

TABLE 4

| | | | | Ex. 23 | Ex. 24 | Ex. 25 | Ex. 26 | Ex. 27 | Ex. 28 | Ex. 29 | Ex. 30 |
|---|---|---|---|---|---|---|---|---|---|---|---|
| | Production method | | | Roll-out | | | | | | | |
| | Glass material | | | Glass material B | | | | | | | |
| | Thickness [mm] | | | 2.1 | | | | 3.2 | | | |
| Strengthening condition | Physical strengthening | | | No | Yes | No | Yes | No | Yes | No | Yes |
| | Primary strengthening | Salt concentration | (mass %) | No | No | 100% KNO$_3$ | 100% KNO$_3$ | No | No | 100% KNO$_3$ | 100% KNO$_3$ |
| | | Temperature and time | | | | 420° C. 90 min | 420° C. 90 min | | | 420° C. 90 min | 420° C. 90 min |
| | Secondary strengthening | Salt concentration | (mass %) | No | No | No | No | No | No | No | No |
| | | Temperature and time | | — | — | — | — | — | — | — | — |
| FSM measurement result | Solar cell side | CS$_0$ | MPa | 0 | — | 686 | 641 | 0 | — | 686 | 656 |
| | | DOL | μm | 0 | — | 5.3 | 5.4 | 0 | — | 5.3 | 5.5 |
| | | DOL-tail | μm | 0 | — | 4.5 | 4.7 | 0 | — | 4.5 | 4.7 |
| | | Surface layer slope | MPa/μm | 0 | — | 152 | 136 | 0 | — | 152 | 140 |
| | Light receiving surface side | CS$_0$ | MPa | 0 | — | — | — | 0 | — | — | — |
| | | DOL | μm | 0 | — | — | — | 0 | — | — | — |
| SLP-2000 measurement result | | CS2 | MPa | 0 | 24 | 37 | 103 | 0 | 62 | 43 | 32 |
| | | DOC | μm | 0 | 292 | 87 | 258 | 0 | 598 | 93 | 587 |
| | | CT | MPa | 0 | 18 | 2 | 13 | 0 | 32 | 1.4 | 16 |
| | | ICT | MPa·μm | 0 | 9715 | 1297 | 6901 | 0 | 22280 | 1775 | 11201 |
| | Deep layer slope average value | 50 to DOC | MPa/μm | 0 | 0.08 | 0.14 | 0.05 | 0.00 | 0.10 | 0.16 | 0.05 |
| | | 400 to t/2 | MPa/μm | 0 | 0.019 | 0 | 0.013 | 0.000 | 0.042 | 0 | 0.020 |
| Appearance property | Gloss | 20° | % | 20 | — | — | — | 20 | — | — | — |
| | | 60° | % | 47 | — | — | — | 46 | — | — | — |
| | | 85° | % | 57 | — | — | — | 50 | — | — | — |
| | DOI (20) | | % | 6 | — | — | — | 4 | — | — | — |
| | Reflection haze value | | % | 22 | — | — | — | 33 | — | — | — |
| Goniophotometer | 0 deg transmission | | % | 7.1 | — | — | — | 11.8 | — | — | — |
| | Total of 0 deg transmission | | % | 20.2 | — | — | — | 27.3 | — | — | — |
| | Resolution index value T | | — | 0.65 | — | — | — | 0.57 | — | — | — |
| | 45 deg reflection | | % | 4.0 | — | — | — | 3.8 | — | — | — |
| | Total of 45 deg reflection | | % | 22.7 | — | — | — | 29.1 | — | — | — |
| | Reflection image diffusion index value R | | — | 0.82 | — | — | — | 0.87 | — | — | — |
| BRDF | Incident angle 0° | | deg | 7 | — | — | — | 6 | — | — | — |
| | Incident angle 20° | | deg | 6 | — | — | — | 6 | — | — | — |
| | Incident angle 40° | | deg | 6 | — | — | — | 5 | — | — | — |
| | Incident angle 60° | | deg | 9 | — | — | — | 8 | — | — | — |
| Surface roughness | Sa | | nm | 12.7 | — | — | — | 11.2 | — | — | — |
| | Sz | | nm | 150.0 | — | — | — | 120.1 | — | — | — |
| | Martens hardness | | N/mm$^2$ | — | — | — | — | — | — | — | — |
| Drop ball test | 500 g iron ball | Average crack height | cm | 11 | 18 | 52 | 54 | 8 | 20 | 28 | 48 |
| | | Energy | J | 0.6 | 0.9 | 2.5 | 2.6 | 0.4 | 1.0 | 1.4 | 2.4 |
| | 900 g iron ball | Average crack height | cm | — | 16 | — | — | 7 | 15 | — | — |
| | | Energy | J | — | 1.4 | — | — | 0.6 | 1.3 | — | — |
| | Ice ball having 55 mmφ | Crack occurrence rate | % | — | — | — | — | — | 0 | — | — |
| | Ice ball having 65 mmφ | Crack occurrence rate | % | — | — | — | — | — | 100 | — | — |
| | Ice ball having 75 mmφ | Crack occurrence rate | % | — | — | — | — | 100 | — | — | — |

TABLE 4-continued

|  |  |  | Ex. 23 | Ex. 24 | Ex. 25 | Ex. 26 | Ex. 27 | Ex. 28 | Ex. 29 | Ex. 30 |
|---|---|---|---|---|---|---|---|---|---|---|
| Flying stone test | Crack occurrence rate | % | — | 100 | — | — | — | 100 | 0 | — |
|  | Scratch area | % | — | — | — | — | — | — | 15 | — |
|  | Flying stone evaluation | — | — | E | — | — | — | E | B | — |

As shown in Tables 1 to 4 and FIG. 4, Examples 1 to 4, 10, 14, 18, 19, 21, 22, 25, 26, and 29 to 32, as Inventive Examples, exhibit more excellent flying stone resistance, drop ball strength, and scratch resistance than of Comparative Examples. Example 31 in which the step A' is performed and Example 32 in which an etching treatment is performed after the step A exhibit more excellent drop ball strength. Examples 2 and 4 as Inventive Examples exhibit more excellent breaking strength than Examples 7, 8 and 9 as Comparative Examples.

Note that, the present application is based on Japanese Patent Application No. 2022-182870 filed on Nov. 15, 2022, Japanese Patent Application No. 2023-54157 filed on Mar. 29, 2023, and Japanese Patent Application No. 2023-170427 filed on Sep. 29, 2023, the contents of which are incorporated herein by reference.

REFERENCE SIGNS LIST

1 protective member
2 support portion
5 mounting portion
10 protective glass
20 sensor
30 camera

The invention claimed is:

1. A chemically strengthened glass, comprising:
a glass having a composition comprising, in mol % based on oxides, 60% or more of $SiO_2$ and 15% or less of $Al_2O_3$,
wherein the glass has having a thickness of more than 2 mm, a surface compressive stress $CS_0$ of 400 MPa to 1,200 MPa, a depth of compressive stress layer DOL-tail of 2.7 µm to 30.0 µm, an absolute value of an average slope of a stress profile from a surface to the DOL-tail of 59 MPa/µm to 500 MPa/µm, a tensile stress CT of 1.0 MPa to 2.6 MPa, and an integrated value, MPa·µm, of the tensile stress of 20,000 or less.

2. The chemically strengthened glass according to claim 1, wherein the glass has an absolute value of an average slope of the stress profile from a position 50 µm from the surface to a DOC of 0.00 MPa/µm to 0.90 MPa/µm.

3. The chemically strengthened glass according to claim 1, wherein a difference between an average concentration of Na from a depth of 25 µm to 30 µm from the surface and a concentration of Na at a thickness center portion is 1% or less as represented by mol % based on oxides.

4. The chemically strengthened glass according to claim 1, wherein an absolute value of a difference between a maximum arrest line depth and a maximum crack depth is 40 µm or more.

5. The chemically strengthened glass according to claim 1, wherein a crack occurrence rate evaluated according to a strength test method in ISO 20567-1 Test Method B is 20% or less.

6. The chemically strengthened glass according to claim 1, wherein a drop ball strength with a 500 g iron ball is 64 cm or more.

7. The chemically strengthened glass according to claim 1, wherein the thickness is 10 mm or less.

8. The chemically strengthened glass according to claim 1, wherein the glass has having a surface roughness Ra of 0.20 nm or more,
the surface is free of a polishing scratch,
a line obtained by a linear approximation of a hydrogen concentration Y in a region at a depth X from an outermost surface of the glass satisfies equation (I) within X=0.1 to 0.4 µm, $$Y = aX + b, \qquad (I)$$

where
Y is hydrogen concentration in terms of $H_2O$, mol/L,
X is depth µm from an outermost surface of the glass.
a is −0.150 to 0.010, and
b is 0.000 to 0.220.

9. The chemically strengthened glass according to claim 1, wherein the thickness is more than 2 mm and 5.8 mm or less, and the depth of compressive stress layer DOL-tail is 0.005T or less in the case where the thickness is T.

10. The chemically strengthened glass according to claim 1, wherein the thickness is more than 2 mm and 10 mm or less, and the depth of compressive stress layer DOL-tail is 10 µm or less.

11. The chemically strengthened glass according to claim 1, wherein the absolute value of the average slope of the stress profile from the surface to the DOL-tail is 59 MPa/µm to 200 MPa/µm.

12. The chemically strengthened glass according to claim 1, wherein collision energy measured by a ball drop test with a 500 g iron ball is 3 J or more.

13. The chemically strengthened glass according to claim 1, wherein in an ice ball test, the chemically strengthened glass does not crack when colliding with an ice ball having a diameter of 55 mm at a speed of 33.9 m/s, wherein the ice ball test is performed by a method where an ice ball is collided with a 100 mm×100 mm glass.

14. A solar power generation module, comprising:
a light receiving surface plate; and
a solar cell substrate laminated in an order of the light receiving surface plate and the solar cell substrate from a light receiving surface side to a back surface side,
wherein the light receiving surface plate is the chemically strengthened glass of claim 1, and a content of Sn in a range from a surface to a depth of 5 µm on a light receiving surface of the light receiving surface plate is 10 times or more a content of Sn in a range from a surface to a depth of 5 µm on a facing surface against the light receiving surface of the light receiving surface plate.

15. A solar power generation module, comprising:
a light receiving surface plate; and
a solar cell substrate laminated in an order of the light receiving surface plate and the solar cell substrate from a light receiving surface side to a back surface side,
wherein the light receiving surface plate is the chemically strengthened glass of claim 1, and
an absolute value of a difference between $CS_0$ on a light receiving surface of the light receiving surface plate and $CS_0$ on a facing surface against the light receiving surface of the light receiving surface plate is 10 MPa or more.

16. A solar power generation module, comprising:
a light receiving surface plate;
a solar cell substrate; and
a back surface plate laminated in an order of the light receiving surface plate, the solar cell substrate, and the back surface plate from a light receiving surface side to a back surface side,
wherein the light receiving surface plate is the chemically strengthened glass of claim 1, and
the back surface plate is made of a glass having a thickness 1 mm or more smaller than a thickness of the light receiving surface plate.

17. The chemically strengthened glass according to claim 1, wherein the glass has a first main surface, a second main surface facing the first main surface, and an end portion,
in either the first main surface or the second main surface, one corner among four corners is different in shape, or four corners are different from one another in shape, and
the end portion is subjected to C chamfering or R chamfering.

18. A building, comprising:
an outer surface member comprising the chemically strengthened glass of claim 1.

19. The chemically strengthened glass according to claim 1, wherein the tensile stress CT is 2.5 MPa to 2.6 MPa.

20. The chemically strengthened glass according to claim 1, wherein the absolute value of the average slope of the stress profile from the surface to the DOL-tail is 100 MPa/μm to 500 MPa/μm.

* * * * *